(12) United States Patent  
Yamazaki et al.

(10) Patent No.: US 7,705,357 B2
(45) Date of Patent: *Apr. 27, 2010

(54) THIN FILM TRANSISTOR WITH CHANNEL REGION IN RECESS

(75) Inventors: Shunpei Yamazaki, Setagaya (JP); Kiyoshi Kato, Sagamihara (JP); Atsuo Isobe, Atsugi (JP); Hidekazu Miyairi, Atsugi (JP); Hideomi Suzawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 103 days.

This patent is subject to a terminal disclaimer.

(21) Appl. No.: 10/377,725

(22) Filed: Mar. 4, 2003

(65) Prior Publication Data

US 2004/0026696 A1    Feb. 12, 2004

(30) Foreign Application Priority Data

Mar. 5, 2002  (JP)  ............................ 2002-059418
Apr. 19, 2002  (JP)  ............................ 2002-118322

(51) Int. Cl.
*H01L 29/04* (2006.01)
*H01L 31/036* (2006.01)
*H01L 31/112* (2006.01)

(52) U.S. Cl. ........................... 257/72; 257/64; 257/66
(58) Field of Classification Search ............. 257/52–72; 438/149–166
See application file for complete search history.

(56) References Cited

U.S. PATENT DOCUMENTS

| | | | |
|---|---|---|---|
| 4,330,363 A | 5/1982 | Biegesen et al. | |
| 4,385,937 A | 5/1983 | Ohmura | |
| 4,565,584 A | 1/1986 | Tamura et al. | |
| 4,933,298 A | 6/1990 | Hasegawa | |
| 5,097,297 A | 3/1992 | Nakazawa | |
| 5,163,220 A | 11/1992 | Zeto et al. | |

(Continued)

FOREIGN PATENT DOCUMENTS

EP    1 049 144    11/2000

(Continued)

OTHER PUBLICATIONS

M.W. Geis, et al., *Crystallographic Orientation of Silicon on an Amorphous Substrate Using an Artificial Surface-Relief Grating and Laser Crystallization*, App. Phys. Lett. 35(1), Jul. 1, 1979, pp. 71-74.

(Continued)

*Primary Examiner*—Shouxiang Hu
(74) *Attorney, Agent, or Firm*—Eric J. Robinson; Robinson Intellectual Property Law Office, P.C.

(57) ABSTRACT

A semiconductor element with high current drive capability, capable of high-speed operation, and having little variation in pluralities of semiconductor elements is provided. It is characterized by the fact that semiconductor elements have a first crystalline semiconductor region including pluralities of crystal orientations, and the first crystalline semiconductor region being connected to a second crystalline semiconductor region which is conductive, wherein the first crystalline semiconductor region is extended in the direction parallel to the insulating film which extends in linear-shaped stripe pattern on the insulating surface, and the second crystalline semiconductor region is provided ranging over the insulating film which extends in linear-shaped stripe pattern.

24 Claims, 31 Drawing Sheets
(1 of 31 Drawing Sheet(s) Filed in Color)

U.S. PATENT DOCUMENTS

| | | | |
|---|---|---|---|
| 5,432,122 | A | 7/1995 | Chae |
| 5,643,826 | A | 7/1997 | Ohtani et al. |
| 5,696,003 | A | 12/1997 | Makita et al. |
| 5,747,828 | A | 5/1998 | Hata et al. |
| 5,821,562 | A | 10/1998 | Makita et al. |
| 5,828,082 | A | 10/1998 | Wu |
| 5,841,097 | A | 11/1998 | Esaka et al. |
| 5,854,803 | A | 12/1998 | Yamazaki et al. |
| 5,886,376 | A | 3/1999 | Acovic et al. |
| 5,893,730 | A | 4/1999 | Yamazaki et al. |
| 5,894,151 | A | 4/1999 | Yamazaki et al. |
| 5,929,479 | A | 7/1999 | Oyama |
| 5,937,282 | A | 8/1999 | Nakajima et al. |
| 5,956,581 | A | 9/1999 | Yamazaki et al. |
| 5,981,974 | A | 11/1999 | Makita |
| 5,986,306 | A | 11/1999 | Nakajima et al. |
| 6,160,269 | A | 12/2000 | Takemura et al. |
| 6,177,301 | B1 * | 1/2001 | Jung ................ 438/150 |
| 6,204,520 | B1 | 3/2001 | Ha et al. |
| 6,288,414 | B1 | 9/2001 | Ahn |
| 6,294,815 | B1 | 9/2001 | Yamazaki et al. |
| 6,300,175 | B1 | 10/2001 | Moon |
| 6,326,249 | B1 | 12/2001 | Yamazaki et al. |
| 6,365,933 | B1 | 4/2002 | Yamazaki et al. |
| 6,410,368 | B1 | 6/2002 | Kawasaki et al. |
| 6,429,100 | B2 | 8/2002 | Yoneda |
| 6,472,684 | B1 | 10/2002 | Yamazaki et al. |
| 6,479,331 | B1 | 11/2002 | Takemura |
| 6,509,217 | B1 | 1/2003 | Reddy |
| 6,512,246 | B1 | 1/2003 | Tanabe |
| 6,528,397 | B1 | 3/2003 | Taketomi et al. |
| 6,555,875 | B2 | 4/2003 | Kawasaki et al. |
| 6,558,989 | B1 | 5/2003 | Moon |
| 6,583,440 | B2 | 6/2003 | Yasukawa |
| 6,599,783 | B2 | 7/2003 | Takatoku |
| 6,635,555 | B2 | 10/2003 | Voutsas |
| 6,636,280 | B1 | 10/2003 | Miyazawa et al. |
| 6,667,188 | B2 | 12/2003 | Tanabe |
| 6,674,136 | B1 | 1/2004 | Ohtani |
| 6,677,191 | B1 | 1/2004 | Battersby |
| 6,700,133 | B1 | 3/2004 | Ohtani et al. |
| 6,717,633 | B2 | 4/2004 | Murade |
| 6,780,687 | B2 | 8/2004 | Nakajima et al. |
| 6,812,491 | B2 * | 11/2004 | Kato et al. ................ 257/66 |
| 6,841,797 | B2 * | 1/2005 | Isobe et al. ................ 257/64 |
| 6,847,050 | B2 * | 1/2005 | Yamazaki et al. ........... 257/59 |
| 6,875,998 | B2 | 4/2005 | Kato et al. |
| 6,879,002 | B2 | 4/2005 | Miyamoto et al. |
| 6,930,326 | B2 * | 8/2005 | Kato et al. ................ 257/59 |
| 6,933,527 | B2 | 8/2005 | Isobe et al. |
| 6,961,361 | B1 | 11/2005 | Tanaka |
| 7,064,016 | B2 | 6/2006 | Kasahara et al. |
| 7,115,903 | B2 * | 10/2006 | Isobe et al. ................ 257/59 |
| 7,145,175 | B2 * | 12/2006 | Kato et al. ................ 257/59 |
| 2001/0000243 | A1 | 4/2001 | Sugano et al. |
| 2001/0015441 | A1 | 8/2001 | Kawasaki et al. |
| 2001/0035526 | A1 | 11/2001 | Yamazaki et al. |
| 2001/0036755 | A1 | 11/2001 | Tanaka |
| 2001/0055830 | A1 | 12/2001 | Yoshimoto |
| 2002/0008801 | A1 | 1/2002 | Fukada et al. |
| 2002/0047971 | A1 | 4/2002 | Kwon et al. |
| 2002/0048864 | A1 | 4/2002 | Yamazaki et al. |
| 2002/0056699 | A1 | 5/2002 | Sun et al. |
| 2002/0098628 | A1 | 7/2002 | Hamada et al. |
| 2002/0134981 | A1 | 9/2002 | Nakamura et al. |
| 2002/0139981 | A1 | 10/2002 | Young |
| 2002/0192956 | A1 | 12/2002 | Kizilyalli et al. |
| 2003/0141505 | A1 | 7/2003 | Isobe et al. |
| 2003/0141521 | A1 | 7/2003 | Isobe et al. |
| 2003/0186490 | A1 | 10/2003 | Kato et al. |
| 2003/0218169 | A1 | 11/2003 | Isobe et al. |
| 2003/0218171 | A1 | 11/2003 | Isobe et al. |
| 2003/0219935 | A1 | 11/2003 | Miyairi et al. |
| 2003/0230749 | A1 * | 12/2003 | Isobe et al. ................ 257/59 |
| 2004/0063258 | A1 | 4/2004 | Kasahara et al. |
| 2005/0029518 | A1 * | 2/2005 | Kato et al. ................ 257/59 |
| 2006/0033872 | A1 | 2/2006 | Sasuga et al. |

FOREIGN PATENT DOCUMENTS

| | | |
|---|---|---|
| JP | 57-196522 | 12/1982 |
| JP | 58-015226 | 1/1983 |
| JP | 61-241909 | 10/1986 |
| JP | 62-104117 | 5/1987 |
| JP | 07-130652 | 5/1995 |
| JP | 08-078329 | 3/1996 |
| JP | 08-088369 | 4/1996 |
| JP | 08-195357 | 7/1996 |
| JP | 09-129891 | 5/1997 |
| JP | 10-135468 | 5/1998 |
| JP | 10-135469 | 5/1998 |
| JP | 11-121753 | 4/1999 |
| JP | 11-354442 | 12/1999 |
| JP | 2000-068520 | 3/2000 |
| JP | 2001-011085 | 1/2001 |
| JP | 2001-144027 | 5/2001 |
| JP | 2001-144302 | 5/2001 |
| JP | 2001-196599 | 7/2001 |
| JP | 2002-014337 | 1/2002 |
| JP | 2002-033330 | 1/2002 |
| JP | 2002-313811 | 10/2002 |
| JP | 2002-324808 | 11/2002 |

OTHER PUBLICATIONS

M.W. Geis, et al., *Crystalline Silicon on Insulators by Graphoepitaxy*, IEDM 1979, Technical Digest of International Electron Devices Meeting, Jan. 1, 1979, pp. 210-212.

M.W. Geis, et al., *Grapho-Epitaxy of Silicon on Fused Silica Using Surface Micropatterns and Laser Crystallization*, Journal of Vacuum Science & Technology, vol. 16, No. 6, Nov. 1, 1979, pp. 1640-1643.

H.I. Smith et al., *Oriented Crystal Growth on Amorphous Substrates Using Artificial Surface-Relief Gratings*, Applied Physics Letters, vol. 32, No. 6, Mar. 15, 1978, pp. 349-350.

D.K. Biegelsen et al., *Laser-Induced Crystallization of Silicon Islands on Amorphous Substrates: Multilayer Structures*, Applied Physics Letters, vol. 38, No. 3, Feb. 1, 1981, pp. 150-152.

H.W. Lam, et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, Oct. 1, 1980, pp. 206-208.

* cited by examiner d < t02, W1 AND W2 ARE COMPARABLE TO 1 μm OR LESS d ~ t02, W1 AND W2 ARE COMPARABLE TO 1μm OR LESS d~t02, W1 AND W2 ARE COMPARABLE TO 1μm OR A LITTLE LARGER d~t02, W1 AND W2 ARE LARGER THAN 1 μm d>t02, W1 AND W2 ARE COMPARABLE TO 1 μm OR LESS

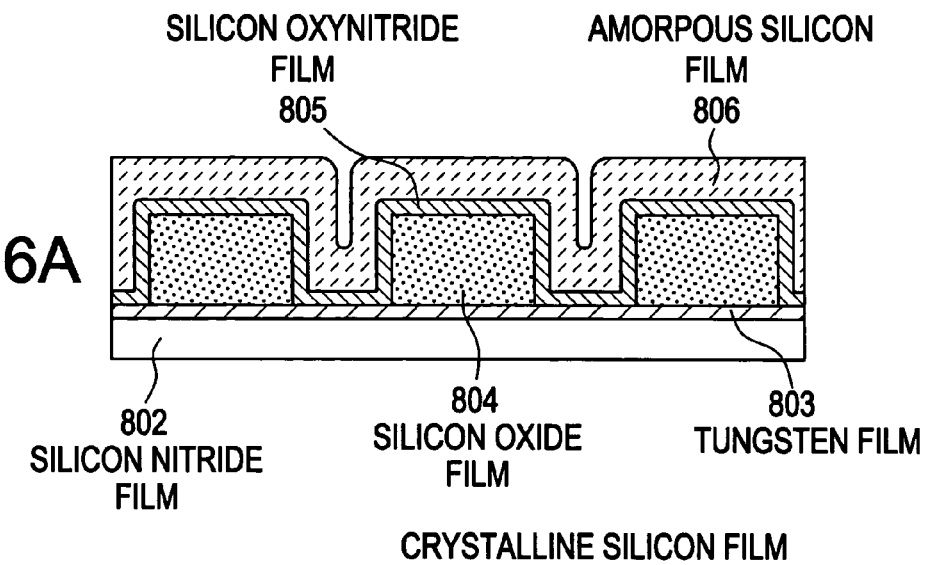
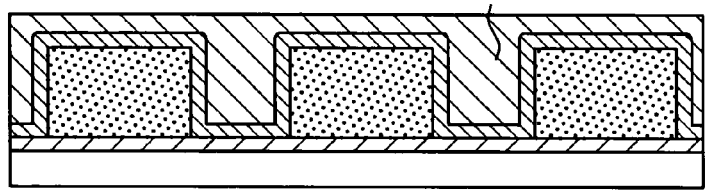
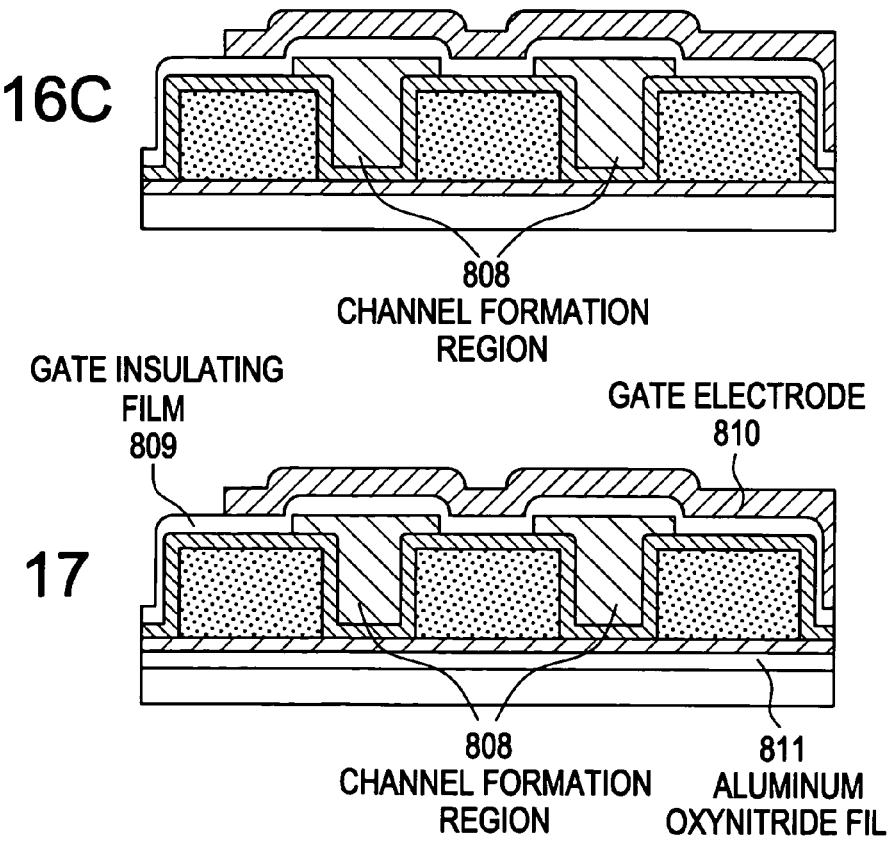

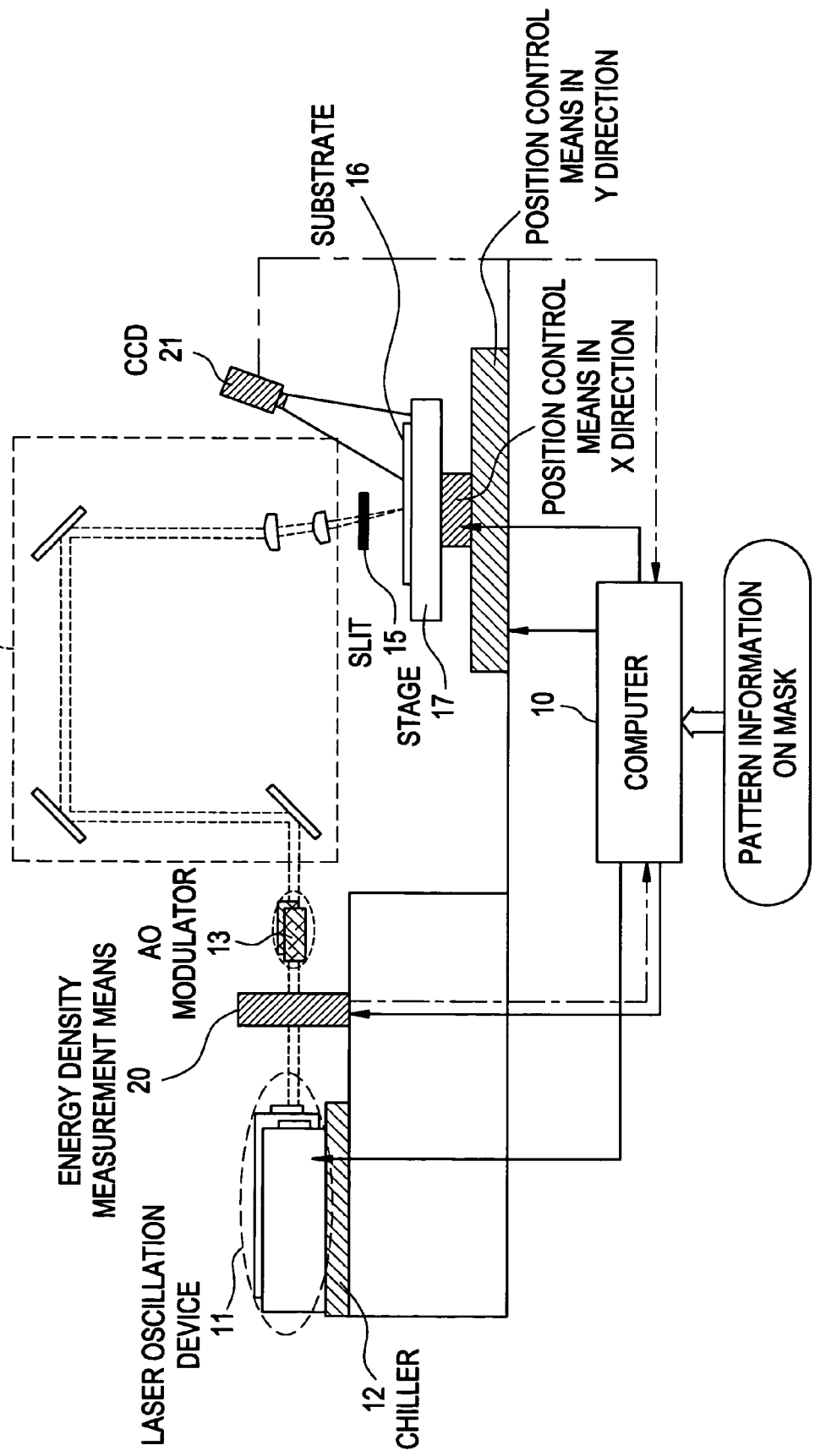

DISTRIBUTION OF ENERGY DENSITY ALONG A - A'

|—— 2μm ——|

CRYSTALLINE SILICON FILM 307

LAMINATE OF FIRST INSULATING FILM 302 AND SECOND INSULATING FILM 303

1μm

100nm

SECOND INSULATING FILM 303
CRYSTALLINE SILICON FILM 307a
CRYSTALLINE SILICON FILM 307b
302 FIRST INSULATING FILM
305 THIRD INSULATING FILM

THIN FILM TRANSISTOR WITH CHANNEL REGION IN RECESS

BACKGROUND OF THE INVENTION

1. Field of the Invention

The present invention relates to a semiconductor element formed using a semiconductor film with a crystal structure and a method for manufacturing the same, and relates to a semiconductor device equipped with a circuit which integrated the semiconductor element and a method for manufacturing the same. This invention especially relates to a thin film diode using a Field Effect Transistor (Typically Thin-Film Transistor) and a crystalline semiconductor film. This Field Effect Transistor forms a channel formation region by a crystalline semiconductor film, which is formed on an insulating surface as a semiconductor element.

2. Related Art

Technology of forming semiconductor elements such as a transistor produced in such a way that an amorphous silicon film is formed on an insulating substrate and crystallized, is developed. Especially the technology of irradiating laser beams and crystallizing the amorphous silicon film is applied to the manufacture technology of a thin-film transistor (TFT). A transistor produced using semiconductor films (crystalline semiconductor films) with crystal structure is applied to a plane type display device (flat panel display) represented by a crystal display device.

Technology of re-crystallization of a damage layer and an amorphous semiconductor film formed on a semiconductor substrate or semiconductor films and the technology of crystallization of the amorphous semiconductor films formed on the insulating surface is developed by using laser beams in a semiconductor manufacture process. Widely used laser beams for a laser oscillation device applied for this semiconductor manufacture process is represented by a gas laser such as an excimer laser, and a solid-state laser such as a YAG laser.

An example of crystallization of an amorphous semiconductor film by irradiation of laser beams is disclosed in JP-A-62-104117, which proposes a poly-crystallization of the amorphous semiconductor film by high-speed scan with the scanning speed of laser beams set to more than a diameter of beam spot×5000/second, without making the amorphous semiconductor film result in a perfect melting state. In addition, U.S. Pat. No. 4,330,363 discloses a technology to form a single crystal region substantially on a semiconductor film, which is formed in the shape of an island by irradiating the extended laser beams. Or JP-A-8-195357 discloses a crystallization method of an amorphous semiconductor film using such as a laser processing apparatus, which processes a light beam in linear form before irradiation in an optical system.

Further, JP-A-2001-144027 proposes a technology such that crystalline semiconductor films with large grain size are formed by irradiating laser beams of a second harmonic wave onto the amorphous semiconductor films using solid laser oscillation device such as Nd:YVO$_4$ laser. A transistor is thus constituted.

However, when crystallization is made by irradiating the laser beams onto the amorphous semiconductor film formed on the flat surface, the crystal was made into poly-crystals, producing defects such as a grain boundary which was formed improperly. Therefore, crystal orientations without deviation could not be obtained.

Crystal defects are involved in a grain boundary, resulting in a carrier trap. This may be considered as a causative factor that migration degree of electron or holes falls. Also, the semiconductor films with neither deviation nor crystal defects could not be formed due to a volume contraction of the semiconductor films caused by crystallization, thermal stress applied to a ground material, or lattice mismatching. Accordingly, if special methods such as bond-and-etchback SOI (Silicon on Insulator) are excluded, the crystallized or re-crystallized crystalline semiconductor films formed on an insulating surface, could not obtain an equivalent quality to a MOS transistor which is formed on a single crystal substrate.

The above-described flat panel display device and the like have semiconductor films formed on glass substrates to constitute a transistor. However, it was almost impossible to arrange a transistor so as to obviate a grain boundary formed improperly. That is, the grain boundary or crystal defects involved therein unexpectedly could not be eliminated by controlling the crystallizability of the channel formation regions of a transistor strictly. Consequently, this produced a causative factor of not only the inferior electrical property of a transistor, but also variation in each element characteristics.

Especially when crystalline semiconductor films are formed on a non-alkali glass substrate currently used abundantly industrially by using laser beams, the focus of the laser beams varies in response to the influence of the surge of the non-alkali glass substrate itself, involving a problem of causing crystalline variation as a result. Furthermore, in order for a non-alkali glass substrate to avoid contamination by the alkaline metal, it is necessary to prepare protection films such as insulating films, as ground films. And it was almost impossible to form thereon the crystalline semiconductor films with large grain size and with no grain boundary and crystal defects, which were eliminated.

SUMMARY OF THE INVENTION

In view of the above-described problems, object of this invention is to provide a semiconductor device having crystalline semiconductor films formed on the insulating substrate, especially on the insulating surface where a glass substrate serves as a support base, with no grain boundary existing at least in channel formation regions, constituted by semiconductor elements or semiconductor element group with high current drive capability and little variation in pluralities of elements, and capable of high-speed operation.

In order to overcome the above-described problems, in this invention an insulating film including recesses or projections extending in linear stripe pattern is formed on a substrate with an insulating surface. And an amorphous semiconductor film is formed on the insulating film. Then a crystalline semiconductor film which was crystallized in such a way that a semiconductor film is melted and poured in a portion corresponding to the recesses of the insulating film (referred as only recesses hereinafter) is formed. Further, a crystalline semiconductor film which is separated in the shape of an island from the crystalline semiconductor film (serving as a part of the semiconductor elements henceforth) after etching removal of the unnecessary regions is carried out is formed. And a gate insulating film and a gate electrode are provided on the crystalline semiconductor film so that the part to form a channel formation region may serve as a crystalline semiconductor film formed on the recesses.

Incidentally, as for the insulating film including recesses and the projections (referred as only projections henceforth), the crystallizability of the crystalline semiconductor film formed on the projections is inferior compared with the crystalline semiconductor film formed on the recesses. However, in this invention, the crystalline semiconductor films formed on the projections are positively used as an electrode (if it is a thin-film transistor, it is equivalent to a sauce region or a drain region), or wiring. When using as wiring, since the flexibility of the design about occupancy area is high, adaptation is widened such that wiring length is adjusted to use as resistance, or by assuming a crooked-shaped form it is possible to function as a protection circuit.

Recesses may satisfactorily be formed by direct etching processing over the surface of the insulating substrate, or may be formed by indirect etching processing using silicon oxide, silicon nitride or silicon oxynitride film and carrying out etching processing of those films. Recesses are formed according to a semiconductor element, and the arrangement of the island-shaped semiconductor film including a channel formation region of a transistor especially, and preferably formed in agreement with the channel formation region at least. Moreover, the recesses are provided in an extending manner in the direction of channel length. The width of the recesses (the channel width direction in case of defining as a channel formation region) is formed by 0.01 µm or more and 2 µm or less, or formed by 0.1 µm to 1 µm preferably, and the depth is formed by 0.1 µm or more and 3 µm or less, or 0.1 µm or more and 2 µm or less preferably.

Of course, it is also possible to form an insulating island-shaped film on the insulating surface, and to form projections positively. In this case, since the projections extending in linear stripe patterns adjacently forms the portion corresponding to the recesses relatively. Therefore, the recesses may be formed according to the arrangement of the island-shaped semiconductor film including a channel formation region of a semiconductor element, and the width may be contained in the aforementioned range also.

An amorphous semiconductor film or a poly-crystal semiconductor film formed by plasma CVD method, sputtering method, and decompression CVD method, or a poly-crystal semiconductor film formed by a solid phase growth is applied for a semiconductor film which is formed covering from the insulating film to recesses in the first stage. In addition, the amorphous semiconductor film as used in this invention includes not only the film with perfect amorphous structure in a narrow meaning but the state where a fine crystal particle is included or the so-called fine crystal semiconductor film, and a semiconductor film including a crystal structure locally are also included. An amorphous silicon film is applied typically, in addition an amorphous silicon germanium film, an amorphous silicon carbide film, and the like can also be applied. Moreover, a poly-crystal semiconductor film is formed by crystallizing these amorphous semiconductor films by the well-known method.

The means by which the crystalline semiconductor film is melted and crystallized includes a pulse oscillation defining a gas laser oscillation device or a solid laser oscillation device as a light source, or continuous oscillator laser beams. The laser beams to irradiate are lineally condensed in an optical system, distribution strength has a uniform region in the lengthwise direction, and the laser beams to irradiate may have a distribution in the orthogonal direction also. Short beam solid laser oscillation device is applied for the laser oscillation device used as a light source, and especially slab laser oscillation device is applied preferably. Or the combination of the solid laser oscillation device and a slab structure amplifier may be applied also. The solid laser oscillation device uses a Nd, Tm, and Ho doped rod, or especially uses the Nd, Tm, and Ho doped crystal such as YAG, $YVO_4$, YLF, $YAlO_3$. As a slab material, crystal such as Nd:YAG, Nd:GGG (gadolinium, gallium, garnett), or Nd:GSGG (gadolinium, scandium, gallium, garnett) of GSGG is used. The slab laser proceeds inside of the tabular laser medium by zigzag optical path, repeating all reflections.

Also strong light, which is compliant with above laser beams may satisfactorily be irradiated. Light with high energy density condensing the light emitted from such as a halogen lamp, a xenon lamp, a high pressure mercury-vapor lamp, a metal halide lamp, and an excimer lamp may be exemplified as such light.

Crystallization or re-crystallization is performed through such process that the laser beam or strong light which was lineally condensed and extended in the lengthwise direction is irradiated onto crystalline semiconductor films, and the irradiation position of the laser beams and substrates having the crystalline semiconductor films formed thereon are moved relatively to scan a part or the whole surfaces thereof, to thereby cause the crystalline semiconductor films to be melted. The scanning direction of the laser beams is performed in the lengthwise direction along the recesses formed on the insulating films and extended lineally in stripe pattern, or in the channel length direction of a transistor. By the above, a crystal can grow along the scanning direction of laser beams, and a grain boundary can be prevented from intersecting the channel length direction.

Moreover, irradiation of laser beams is typically performed from the upper surface side of semiconductor films. However, irradiation method can be varied in such a way that irradiation from an undersurface side (substrate side), irradiation from upper surface slant, or irradiation from undersurface slant, or the irradiation from both-sides of the upper surface and the undersurface (the irradiation from slant is also included) may be performed.

Moreover, as other constitution, crystalline semiconductor films may be provided on the metal layer containing a kind or pluralities of kinds chosen from W, Mo, Ti, Ta, and Cr, on a glass or quartz substrate, with an insulating film intervened between the metal layer and the crystalline semiconductor film. Or the constitution may be formed in such a way that the metal layer containing a kind or pluralities of kinds chosen from W, Mo, Ti, Ta, and Cr and the insulating film consisting of aluminum nitride or aluminum oxynitride on the metal layer are provided on a glass or quartz substrate, and a crystalline semiconductor film is provided on this insulating film. The metal layer formed here can also be served as a shading film which interrupts the light which carries out incidence onto a channel formation region, or can control the spread of a fixed electric charge or depletion layer, by giving a specific potential. Moreover, the metal layer can be served as a heat sink to make a Joule heat diffuse also.

The semiconductor film melted by laser beams or irradiation of strong light, condenses in recesses due to a surface tension and solidified, by setting the depth of the recesses to be comparable as the thickness of the semiconductor film or more. Consequently, the thickness of the semiconductor film formed on the projections of the insulating film can become thin, and can centralize stress deviation there. Moreover, flank side of the recesses specifies a certain level of crystal orientations.

Semiconductor films are condensed with melting state by a surface tension in recesses which is formed on an insulating substrate. Deviation generated with the crystallization can be centralized on regions other than the recesses by carrying out crystal growth from almost intersection of the bottom and the flank side of the recesses. That is, a crystalline semiconductor region (first crystalline semiconductor region) formed so that the recesses may be filled up can be free from deviation. And a crystalline semiconductor region which remains on the insulating film and includes crystal grain boundary and crystal defects (second crystalline semiconductor region) is used for portions other than the channel formation regions of a semiconductor element, and typically used as a sauce region or a drain region.

And after forming a crystalline semiconductor film with no crystal grain boundary existing thereon, an active layer (semiconductor layer serving as a career migration course) of a semiconductor element is formed by patterning, a gate insulating film which is brought into contact with the active layer is formed, and a gate electrode is formed further. A Field Effect Transistor can subsequently be formed by the well-known technology.

By specifying a semiconductor element such as a transistor or especially the region where a channel formation region is formed, it becomes possible to form a crystalline semiconductor region with no grain boundary existing therein. By the above, causative factor of variation in characteristics due to a crystal grain boundary which intervenes improperly or crystal defects, can be eliminated. That is, a semiconductor element or the semiconductor element group with high current drive capability, capable of high-speed operation, and having little variation in pluralities of elements can be achieved.

BRIEF DESCRIPTION OF THE DRAWINGS

The patent or application file contains at least one drawing executed in color Copies of this patent or patent application publication with color drawing(s) will be provided by the Office upon request and payment of the necessary fee.

FIGS. 16A to 16C are longitudinally sectional views explaining the manufacture process of a transistor of this invention.

FIG. 17 is a longitudinally sectional view explaining the manufacture process of a transistor of this invention.

FIG. 21 is a view showing a laser irradiation device used for operation of this invention.

PREFERRED EMBODIMENTS OF THE INVENTION

Embodiment 1

Figure 1:
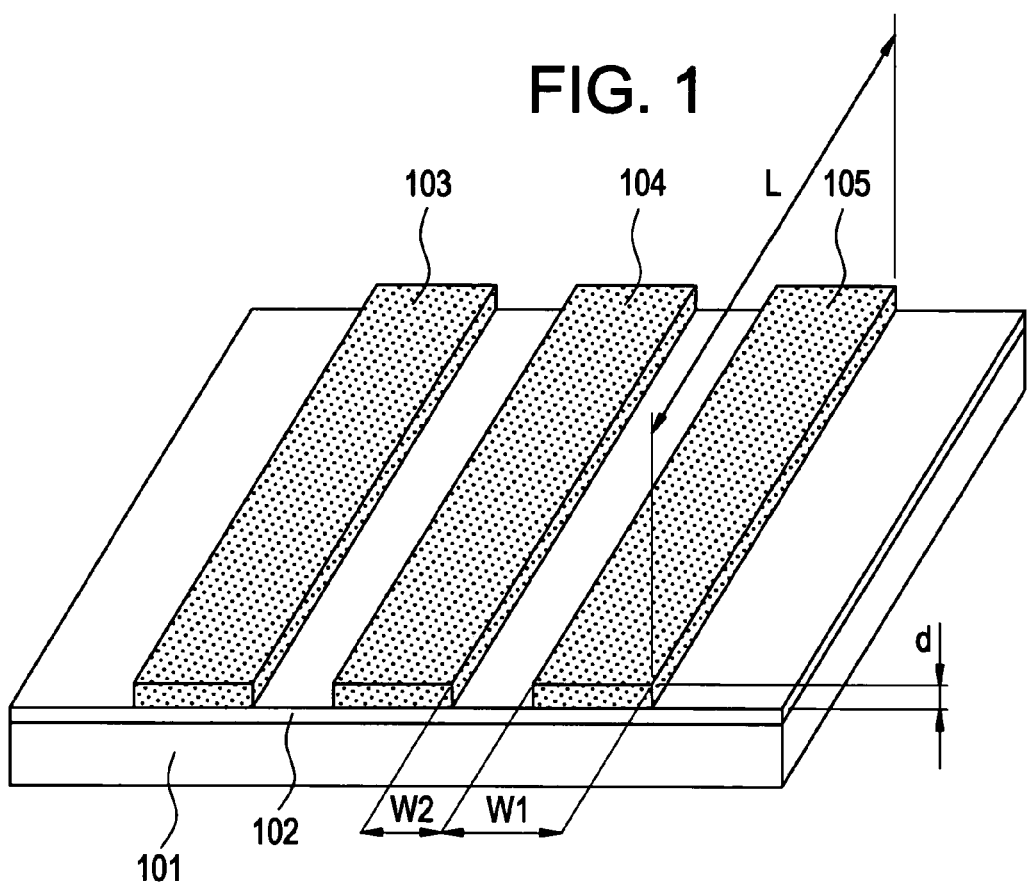
FIG. 1 is a perspective view explaining a crystallization method of this invention.

Preferred embodiment of manufacturing method for a thin film transistor using the present invention will be explained in conjunction with the drawings below. The perspective diagram shown in FIG. 1 shows the film formation where first insulating film 102 and second insulating films 103 to 105 formed in linear stripe pattern are formed on substrate 101. Three linear stripe patterns formed by the second insulating film are shown in FIG. 1. However, the number is not limited to three.

As for substrates, a substrate covering the surface of a commercial non-alkali glass substrate, a quartz substrate, a sapphire substrate, a single crystal, or a poly-crystalline semiconductor substrate with an insulating film, and a substrate covering the surface of a metal board with an insulating film can be applied. For forming a linear stripe pattern with a submicron design rule, it is desirable to set the irregularities on the surface of the substrate, surge or twist of the substrate, to below the focal depth of an exposure apparatus (especially stepper). Specifically, it is desirable for the surge or the twist of the substrate to be set to 1 μm or less, 0.5 μm or less preferably in one time exposure light irradiation region. In this point, cautions are required when using a non-alkali glass as a support base.

Width W1 of the second insulating film formed in a linear stripe pattern is 0.1 to 10 μm (preferably 0.5 to 1 μm), and the interval W2 with the adjoining second insulating film is 0.01 to 2 μm (preferably 0.1 to 1 μm), and thickness d of the second insulating film is 0.01 to 3 μm (preferably 0.1 to 2 μm). Furthermore, the relation with film thickness t02 in recesses of the amorphous semiconductor film provided so as to cover the second insulating film is satisfactorily d≧t02. However, since crystalline semiconductor films stops remaining on projections when d is too thick compared with t02, cautions are required.

Moreover, level difference do not need to be a regular periodic pattern, and may be arranged at a different interval according to the width of an island-shaped semiconductor film. The length L is not numerically limited especially, but long formation covering from the end of a substrate to the other end is possible. For example, the length may be set to the extent such that a channel formation region of a transistor can be formed.

First insulating film 102 may satisfactorily be formed of the material which can secure a selection ratio with the second insulating film formed later. However, the insulating film 102 is typically formed of Silicon Nitride, Silicon oxide, and Silicon oxynitride with a bigger oxygen content than a nitrogen content (indicated as SiOxNy.), silicon nitrioxide with a bigger nitrogen content than an oxygen content (indicated as SiNxOy.), Aluminum Nitride (indicated as AlxNy.), aluminum oxynitride with a bigger oxygen content than a nitrogen content (indicated as AlOxNy), aluminum nitrioxide with a bigger nitrogen content than an oxygen content (indicated as AlNxOy), or the material chosen from the Aluminum Oxide with thickness of 30 to 300 nm. Especially, since blocking effect of an Aluminum Oxide film over sodium (Na) is expectable, the first insulating film is effective as countermeasures against pollution from a glass substrate.

In addition, as a silicon oxynitride (SiOxNy) film, composition ratio is satisfactorily set to 25 to 35 atom % of Si, 55 to 65 atom % of oxygen, 1 to 20 atom % of nitrogen, and 0.1 to 10 atom % of hydrogen contained therein. Also, a silicon nitrioxide (SiNxDy) film where composition ratio is satisfactorily set to 25 to 35 atom % of silicon, 15 to 30 atom % of oxygen, 20 to 35 atom % of nitrogen, and 15 to 25 atom % of hydrogen contained therein may be used. Also, an Aluminum oxynitride (AlOxNy) film where composition ratio is satisfactorily set to 30 to 40 atom % of aluminum, 50 to 70 atom % of oxygen, and 1 to 20 atom % of nitrogen contained therein may be used. Moreover, an aluminum nitrioxide (AlNxOy) film where composition ratio is satisfactorily set to 30 to 50 atom % of aluminum, 30 to 40 atom % of oxygen, and 10 to 30 atom % of nitrogen contained therein may be used.

Also, the second insulating films 103 to 105 may be formed of silicon oxide or silicon oxynitride with thickness of 10 to 3000 nm, preferably 100 to 2000 nm. Silicon oxide can be formed by mixing Tetraethyl Ortho Silicate: TEOS and $O_2$, followed by plasma CVD method. A silicon nitrioxide film can be formed by the plasma CVD method, using $SiH_4$, $NH_3$, $N_2O$ or $SiH_4$, and $N_2O$ as materials.

As shown in FIG. 1, when a linear stripe pattern is formed by the insulating films of two layers, selection ratio is needed to be secured in etching processing between the first insulating film 102 and the second insulating films 103 to 105. In fact, it is preferable to adjust materials and film formation conditions suitably, so that the etching speed of the second insulating films 103 to 105 may become relatively faster than the first insulating film 102. As an etching method, etching using buffer hydrofluoric acid, or dry etching using $CHF_3$ is adopted. And the angle of the flank side of recesses formed on the second insulating films 103 to 105 may be set within 5-120°, preferably within 80-100°.

In addition, as the second insulating films 103 to 105, it is preferable to use the insulating films formed by CVD method (typically plasma CVD method or thermal CVD method) or PVD method (typically a sputtering method or a deposition method). The reason is that softness of the film is considered to be an important factor for obtaining excellent crystallinity, being capable of easing the stress accompanying crystallization when the amorphous semiconductor film is crystallized. The reason of the above will be described hereinafter.

Figure 2:
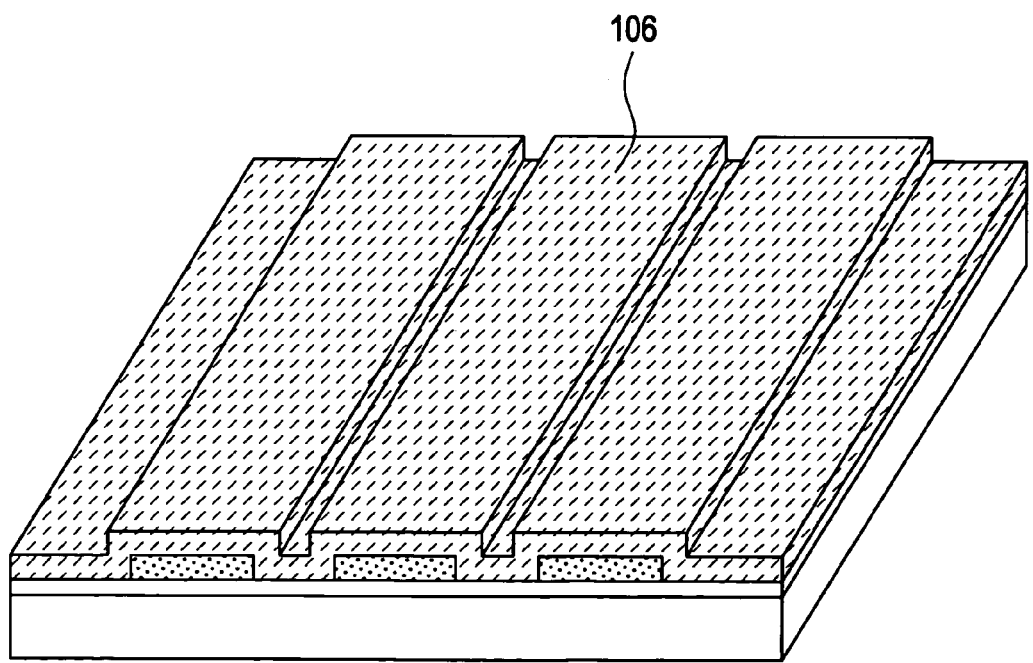
FIG. 2 is a perspective view explaining a crystallization method of this invention.

Next, as shown in FIG. 2, the amorphous semiconductor film 106 which covers over the surface consisting of this first insulating film 102 and the second insulating films 103 to 105 and recesses, is formed in the thickness of 0.01 to 3 μm (preferably 0.1 to 1 μm). The thickness of the amorphous semiconductor film 106 is preferably set to be comparable to the depth of the recesses formed on the second insulating films 103 to 105 or more. Silicon, the compound of silicon and germanium or alloy, or the compound of the silicon and carbon or alloy can be adaptable for the amorphous semiconductor films.

As shown in the figure, amorphous semiconductor film 106 is formed in such a way that the irregular structure formed by the first insulating film 102 and the second insulating films 103 to 105 of a ground material is covered. Also, Silicon oxynitride film may satisfactorily be formed continuously without exposing to an atmosphere within the same film formation device as a third insulating film (not shown) immediately before forming the amorphous semiconductor film 106, so as to obviate the influence of chemical pollution, such as boron which is adhered to the surface of the first insulating film 102 and the second insulating films 103 to 105, and moreover, so as to obviate the direct contact of the insulating surface and the amorphous semiconductor film. Film thickness of the third insulating film aims at exclusion of the influence of the chemical pollution, and improvement in adhesive property, and even thin film is effective enough. Typically, thickness of 5 to 50 nm is satisfactory. (For heightening the blocking effect of chemistry contamination, thickness of 20 nm or more is preferable.)

And this amorphous semiconductor film 106 is melted momentarily, and crystallized. This crystallization is caused by condensing laser beams or emitted light from a lamp light source into the energy density through optical system to the extent that a semiconductor film melts. In this process, it is preferable to use laser beams radiating from a continuous oscillation laser oscillation device as the light source. The laser beams applied is lineally condensed in the optical system, and longitudinally extended. It is preferable for the distribution strength to have a uniform region in a longitudinal direction, and to secure a certain amount of distribution in an orthogonal direction.

In addition, when crystallization occurs, the position where a marker used for mask alignment of patterning is formed later such as the edge of the board, is preferably not crystallized. The reason is that the transmissivity of visible light increases, when crystalline semiconductor film (especially crystalline silicon film) is crystallized, causing difficulty in discernment as a marker. However, the problem is not involved in performing alignment control of the type, which optically identifies differences in contrast due to the level difference of the marker.

Short form beam solid laser oscillation device is applied for the laser oscillation device, and especially slab laser oscillation device is applied preferably. As a slab material, crystal such as Nd:YAG, Nd:GGG (gadolinium, gallium, garnett), or Nd:GSGG (gadolinium, scandium, gallium, garnett) of GSGG is used. The slab laser proceeds inside of the tabular laser medium by zigzag optical path, repeating all reflection. Or a solid laser oscillation device using Nd, Tm, and Ho doped rod, especially the solid laser oscillation device using the crystal in which Nd, Tm, and Ho is doped to the crystal such as YAG, YVO$_4$, YLF, and YAlO$_3$ may be combined with a slab structure amplifier.

Figure 3:
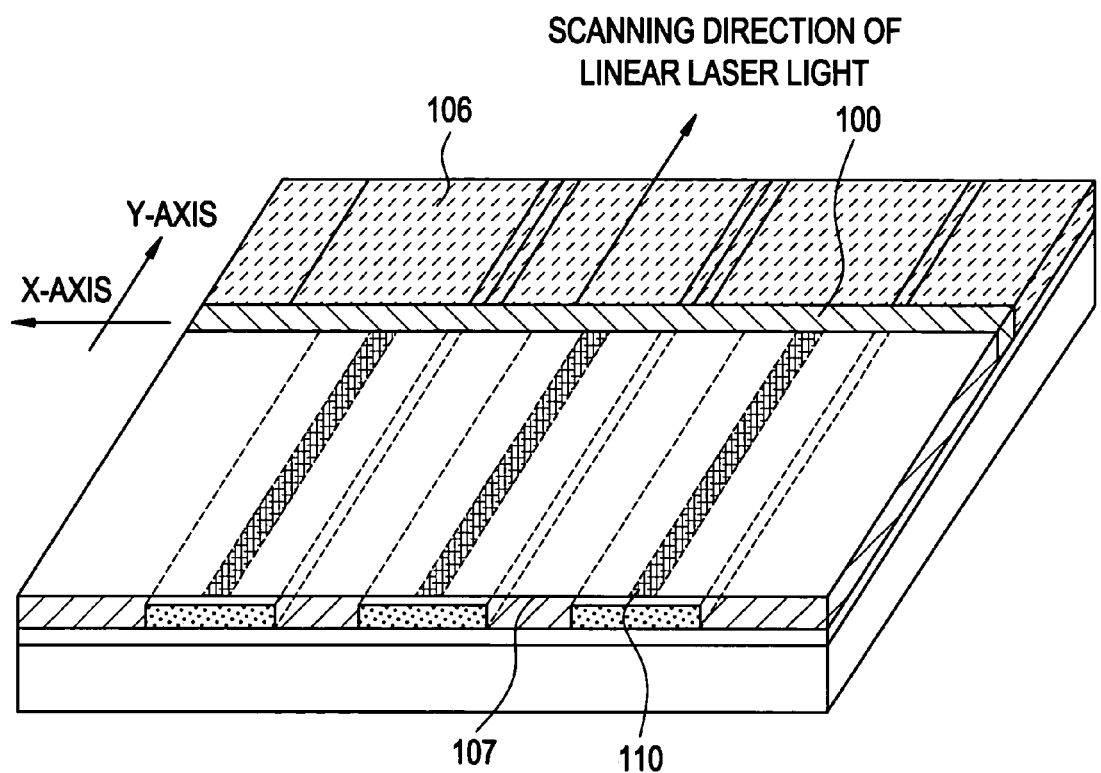
FIG. 3 is a perspective view explaining a crystallization method of this invention.

And as shown by the arrow in FIG. 3, linear laser beams or linear strong light is scanned so that the longer direction of the irradiation region 100 (X-axis direction in the figure) may be intersected with each of the second insulating films 103 to 105 formed in linear strip pattern. In addition, linear form as mentioned here refers to the ratio defined in such a way that the ratio of the longitudinal direction (X-axis direction) to the length of the orthogonal direction (Y-axis direction in the figure) is 1 to 10 or more. Moreover, end portion of the irradiation region 100 of the linear laser beams, which is only partially shown in the FIG. 3, may assume any form either short form or the form with curvature.

Also, the wavelength of continuous oscillation laser beams is preferably set to 400 to 700 nm, in consideration of the optical absorption coefficient of the amorphous semiconductor film. The light of such a wavelength region is obtained by condensing the second harmonic wave of a basic wave and the third harmonic wave using a wavelength conversion element. As a wavelength conversion element, ADP (ammonium dihydrogenphosphate), Ba$_2$NaNb$_5$O$_{15}$ (niobium acid barium sodium), CdSe (selenium cadmium), KDP (potassium dihydrogenphosphate), LiNbO$_3$ (niobium acid lithium) and Se, Te, LBO, BBO, KB5, and the like are applied. It is preferable to use LBO especially. Typically, the second harmonic wave (532 nm) of Nd:YVO$_4$ laser oscillation device (fundamental wave with 1064 nm) is applied. Moreover, the oscillation mode of laser employs the single mode of the TEM$_{00}$ mode.

In case of the silicon chosen as a material most suitable for an amorphous semiconductor film, the region where absorption coefficient is $10^3$ to $10^4$ cm$^{-1}$ is in mostly visible region. When a substrate with high visible light transmissivity such as glass, and the amorphous semiconductor film formed with the thickness of 30 to 200 nm by silicon are crystallized by irradiating the light of visible region with a wavelength of 400 to 700 nm, the semiconductor films can be heated alternatively and crystallization is possible without giving a damage to a ground insulating film. Specifically, the invasion length of light with a wavelength of 532 nm is substantially 100 nm to 1000 nm compared with the amorphous silicon film. This is a length enough to reach the inside of the amorphous semiconductor film 106 formed with 30 nm to 200 nm thickness. Namely, heating from the inner side of the semiconductor films is possible and substantially whole surface of the semiconductor films in the irradiation region of laser beams can be uniformly heated.

Laser beams are scanned in the direction parallel to the direction where a linear stripe pattern extends. Surface tension works and the melted semiconductor flows into recesses and is solidified. The surface becomes almost flat with a solidified state as shown in FIG. 3. This is because the interface of the melted semiconductor and the gaseous phase reaches a balanced state and a flat interface is formed either on projections or recesses when a semiconductor once melts. Furthermore, the growth end and a crystal grain boundary are formed on the second insulating films (on projections) (region 110 shown by hatching in the figure). Crystalline semiconductor film 107 is thus formed.

Then, heat treatment at 500 to 600° C. is performed preferably, so as to remove accumulated deviation on the crystalline semiconductor films. This deviation is generated by volume contraction of a semiconductor caused by crystallization, heat stress with a ground material, and lattice mismatching. This heating process can be satisfied by using the usual heat treatment device. However, 1 to 10 minutes processing may satisfactorily be performed by using the moment heat annealing (RTA) method of a gas heating method. In addition, this process is not obligatory and is selective, in this invention.

Figure 4:
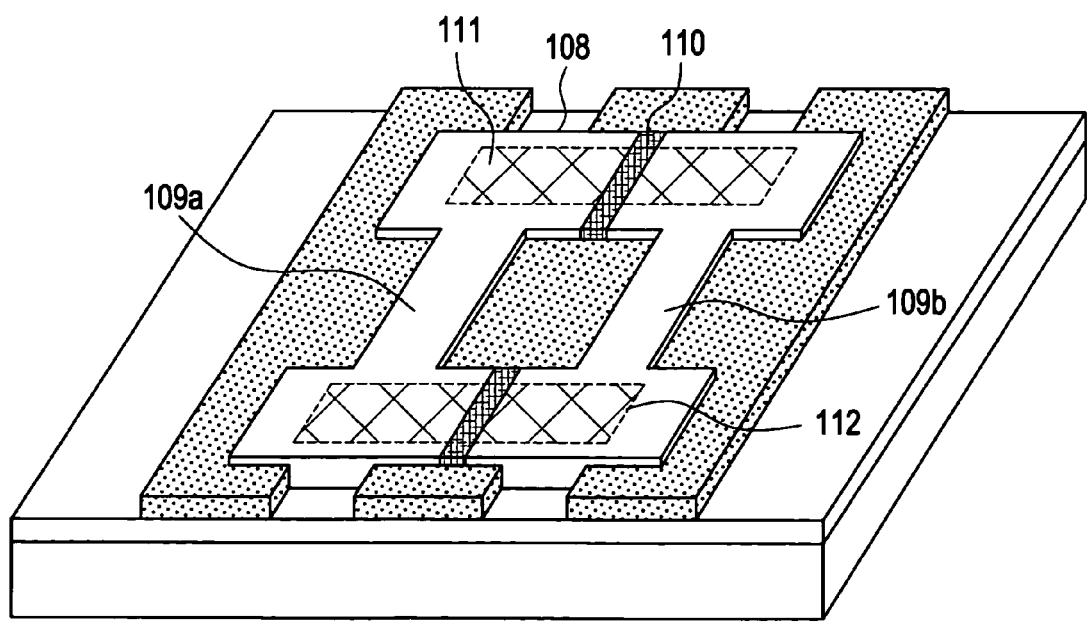
FIG. 4 is a perspective view explaining a crystallization method of this invention.

Then, as shown in FIG. 4, crystalline semiconductor film 107 is subjected to etching and the active layer 108 of a thin-film transistor is formed. At this time, region 110 where a growth end and a crystal grain boundary are concentrated may partially remain. In this invention, by utilizing positively the second crystalline semiconductor regions including region 110 as an electrode such as a source region and a drain region of a thin-film transistor, the design margin of a contact part (region shown by 111 and 112 in FIG. 4) with the electrode (a sauce electrode or a drain electrode) which is connected to the source region, the drain region, and each region is secured. Of course, highly crystalline semiconductor regions (first crystalline semiconductor regions) 109a and 109b formed in the recesses are intended to be used as channel formation regions of a thin-film transistor.

Highly crystalline semiconductor regions 109a and 109b have pluralities of crystal orientations, wherein a crystal grain boundary is not formed. And a gate insulating film and a gate electrode are formed so that the semiconductor regions 109a and 109b may become channel formation regions. A transistor can be completed through each stage in this way.

FIG. 5 is a conceptual diagram showing the information of the crystallization obtained from the experiment result by this inventor. FIG. 5A to FIG. 5E is a schematic diagram showing the relation between the depth and interval of recesses formed by a first insulating film and a second insulating film, and a crystal growth.

In addition, sign and numerals indicating the length shown in FIG. 5 are described as follows:

t01: thickness of the amorphous semiconductor films on the second insulating films (projections);

t02: thickness of the amorphous semiconductor films of recesses;

t11: thickness of the crystalline semiconductor films on the second insulating films (projections);

t12: thickness of the crystalline semiconductor films of recesses;

d: thickness of the second insulating films (depth of recesses);

W1: width of the second insulating film; and

W2: width of recesses.

Figure 5A:
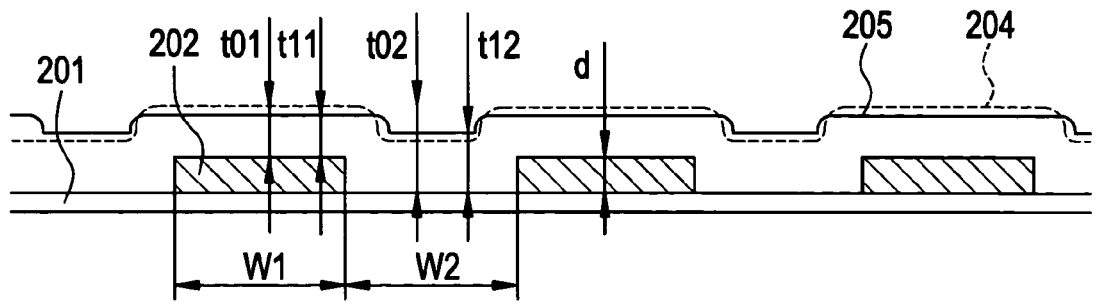
FIGS. 5A to 5E are longitudinal sectional views explaining the relation of the form of an aperture part and the form of a crystalline semiconductor film in crystallization.

FIG. 5A is a view showing the case where d<t02, W1 and W2 are comparable to 1 µm or less, when the depth of the recesses is smaller than the amorphous semiconductor film 204, since the recesses are shallow even after subjected to the melting crystallization process, the surface of the crystalline semiconductor film 205 is not planarized enough. Namely, the surface state of the crystalline semiconductor film 205 is in the state where the irregular form of a ground material is reflected.

Figure 5B:
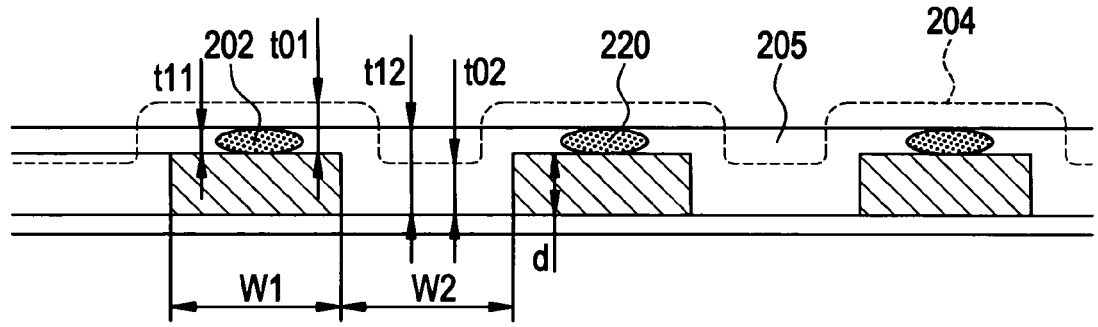

FIG. 5B is a view showing the case where d≧t02, and W1, W2 are comparable to 1 µm or less. In the case where the depth of the recesses almost equal to the amorphous semiconductor film 203 or larger, surface tension works so as to be collected in the recesses. Thereby the surface becomes almost flat as shown in FIG. 5B under solidified state. In this case, it is set to t11<t12, and stress concentrates on the thin part 220 of the second insulating film 202, with the result that deviation is accumulated here and the crystal grain boundary is formed thereon.

Figure 23A:
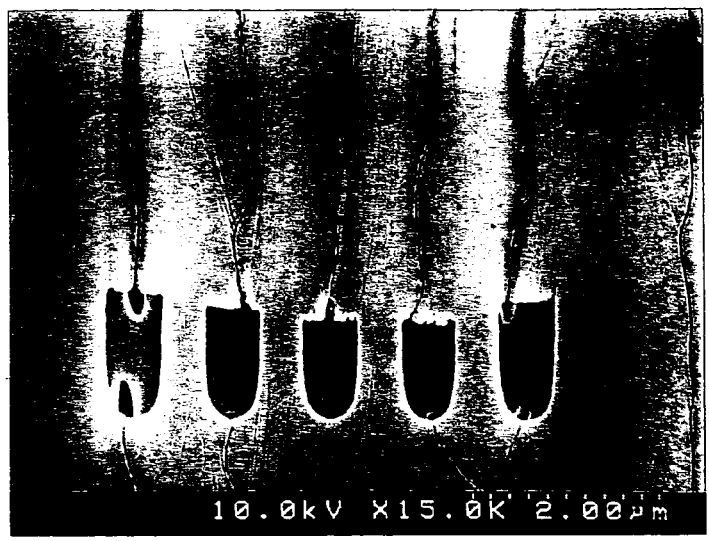
FIGS. 23A and 23B are a TEM photograph and its schematic diagram observing the upper surface of a crystalline silicon film obtained by this invention after Seco etching of the crystalline silicon film.

The scanning electron microscope (SEM) photograph shown in FIG. 23A shows an example of the state of FIG. 5B. This specifically shows the result that 150 nm amorphous silicon film is formed on the ground insulating film with level difference of 170 nm, having width and interval formed of projections of 0.5 µm, and crystallized. Moreover, the surface of crystalline semiconductor film is subjected to etching (referred as secco etching also) over generally known secco-solution (medical fluid prepared using $K_2Cr_2O_7$ as an additive agent over $HF:H_2O=2:1$) in order to elicit the crystal grain boundary.

The result shown in FIG. 23 shows that potassium dichromate ($K_2Cr_2O_7$) 2.2 g was dissolved in 50 cc of water, so as to prepare the 0.15 mol/l of solution. 100 cc of hydrofluoric acid was added to this solution, and the solution was further diluted with-water to five times solution. This was used as secco-solution. Moreover, the condition of secco etching was set to 75 seconds at room temperature (10 to 30° C.). In addition, secco-solution or secco etching as referred in this specification indicates the solution as described here or the condition.

Figure 23B:
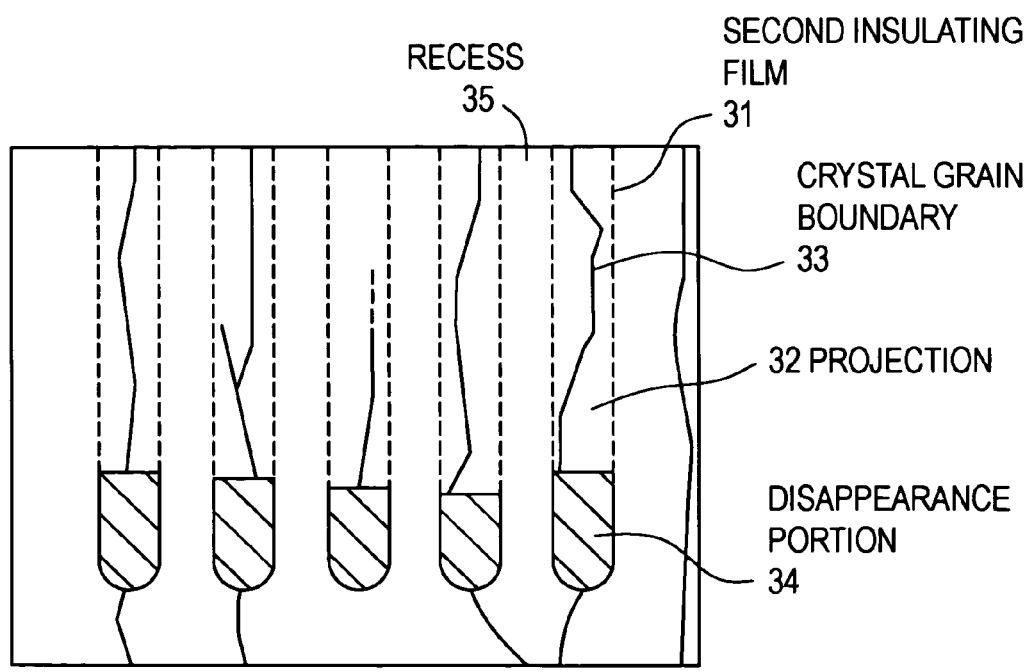

FIG. 23B is a schematic diagram of the photograph of FIG. 23A. In this figure, numeral 31 denotes an insulating film (a second insulating film) extending in linear stripe pattern. Situation that the crystal grain boundary 33 exposed by secco etching and intensively collected in projection 32 can be checked. In addition, region 34 indicated to be a disappearance portion is a field equivalent to the starting point of the stripe pattern, and the scan of laser beams is started from this starting point. Detailed reason is unknown. However, this is a region where the second insulating film located in this starting point is exposed when the silicon film on this starting point is melted, thereby being pushed aside in the scanning direction. Since secco-solution etches silicon oxide films, the region located on this starting point has been disappeared by the secco etching.

By the way, when contrasted with the photograph shown in FIG. 23A, the crystal grain boundary or defects formed on the recess 35 and distinctly shown by secco etching is not exposed. If putting in another way, it turns out that the crystal grain boundary or the defect does not exist substantially. A laminating defect and the crystal grain boundary are predominantly subjected to etching by secco etching is a fact known well. And the crystalline semiconductor film obtained by this invention is characterized to have substantially no crystal grain boundary or defects as exposed by secco etching.

Of course since it is not a single crystal, there may naturally be a grain boundary or defects which are not exposed by secco etching. Since such a grain boundary and defects have no influence on the electrical property when the semiconductor element is manufactured, they are electrically considered to be inactive. Generally such an electrically inactive grain boundary is a so-called planate grain boundary (lower or higher bi-crystal or correlative grain-boundaries). And it is estimated that the grain boundary which is not exposed by secco etching is a planate grain boundary. In view of the above, it is justified in saying that the state where the crystal grain boundary or defects do not exist substantially is the state where the grain boundary does not exist except for the planate grain boundary.

Figure 25:
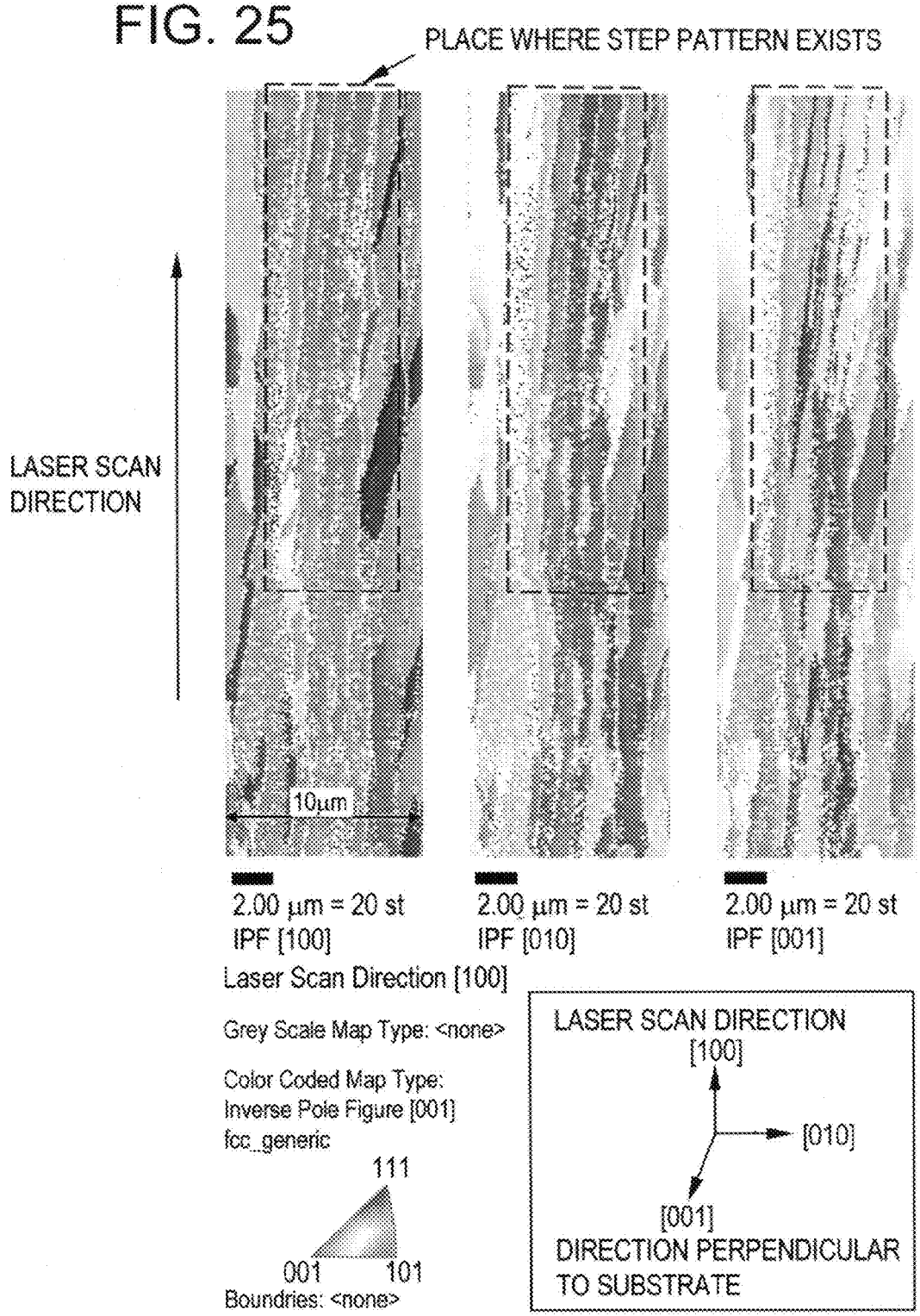
FIG. 25 is EBSP mapping data showing the crystal orientations formed in recesses.

Also, FIG. 25 is a view showing the result of the orientation of the crystalline semiconductor film formed in recesses 35 which was obtained by Electron Backscatter diffraction Pattern (EBSP). EBSP having a detector of exclusive use in a scanning electron microscope, is a method to irradiate an electronic beam onto a crystal surface, and carry out the image recognition of the crystal direction identification from the Kikuchi lines by computer. That micro crystallizability is measured in view of not only the surface orientation but all crystal orientations. (This technique is hereafter referred-as EBSP method for convenience).

Data of FIG. 25 shows that the crystal is growing in the direction parallel to the scanning direction of laser beams lineally condensed in recess 35. <110> directions of the crystal orientations of growth are dominant (that is, main orientation is {110} surface.). However growth of <100> directions also exists.

Figure 5C:
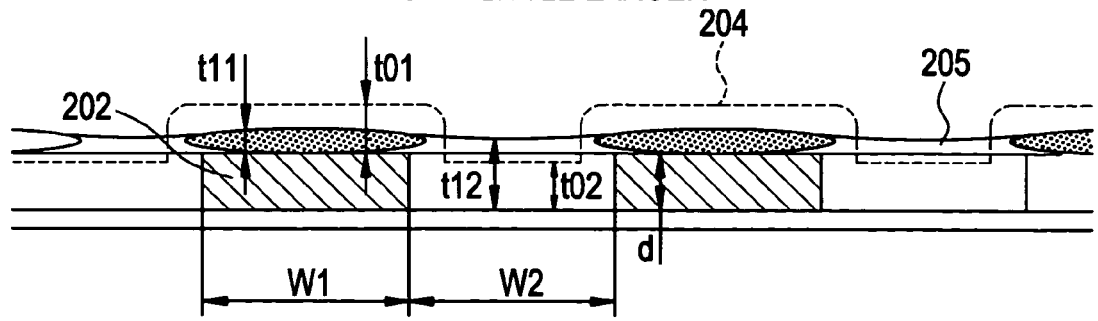

FIG. 5C is a view showing the case where $d \geq t02$ and W1, W2 are comparable to 1 µm or a little larger. When the width of recesses spreads, the recesses are filled up with crystalline semiconductor film 205, having influence on planarizing. However, crystal grain boundary occurs near the center of the recesses. Also, stress concentrates similarly on the second insulating film, accumulating deviation here, and a crystal grain boundary is formed. It is estimated that when an interval spreads, stress relief effect is decreased. Since crystal grain boundary may arise also in a semiconductor region used as a channel formation region on this condition, it is not preferable.

Figure 5D:
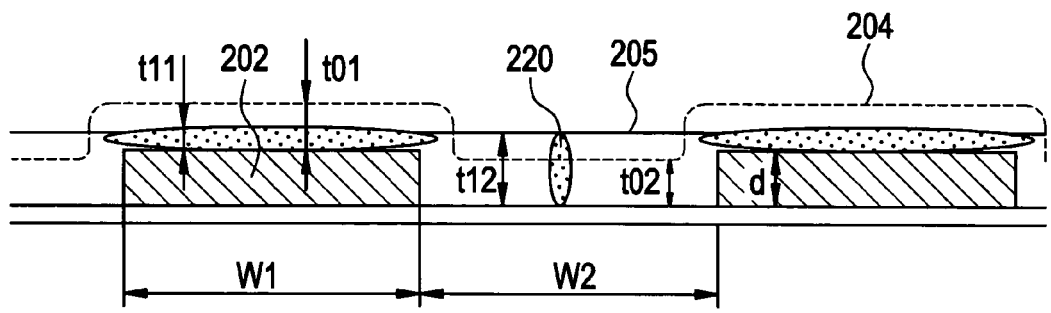

FIG. 5D is a view showing a case where $d \geq t02$ and W1, W2 are larger than 1.0 µm, wherein the state of FIG. 5C is further exposed. The current state is an unfavorable situation due to a crystal grain boundary which is highly likely to generate in a semiconductor region serving as a channel formation region.

Figure 24A:
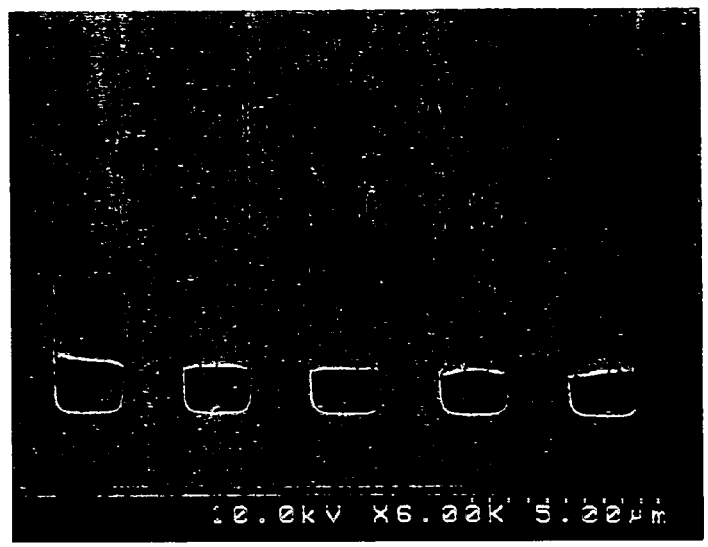
FIGS. 24A and 24B are a TEM photograph and its schematic diagram observing the upper surface of the crystalline silicon film obtained by this invention after Seco etching of the crystalline silicon film.

The scanning electron microscope (SEM) photograph shown in FIG. 24A shows an example of the state of FIG. 5D. This specifically shows the result that amorphous silicon film with 150 nm is formed on a ground insulating film with level difference of 170 nm, having width and interval of projections of 1.8 µm, and being crystallized. In order to expose the crystal grain boundary, the surface of the crystalline semiconductor film is subjected to etching over secco solution.

Figure 24B:
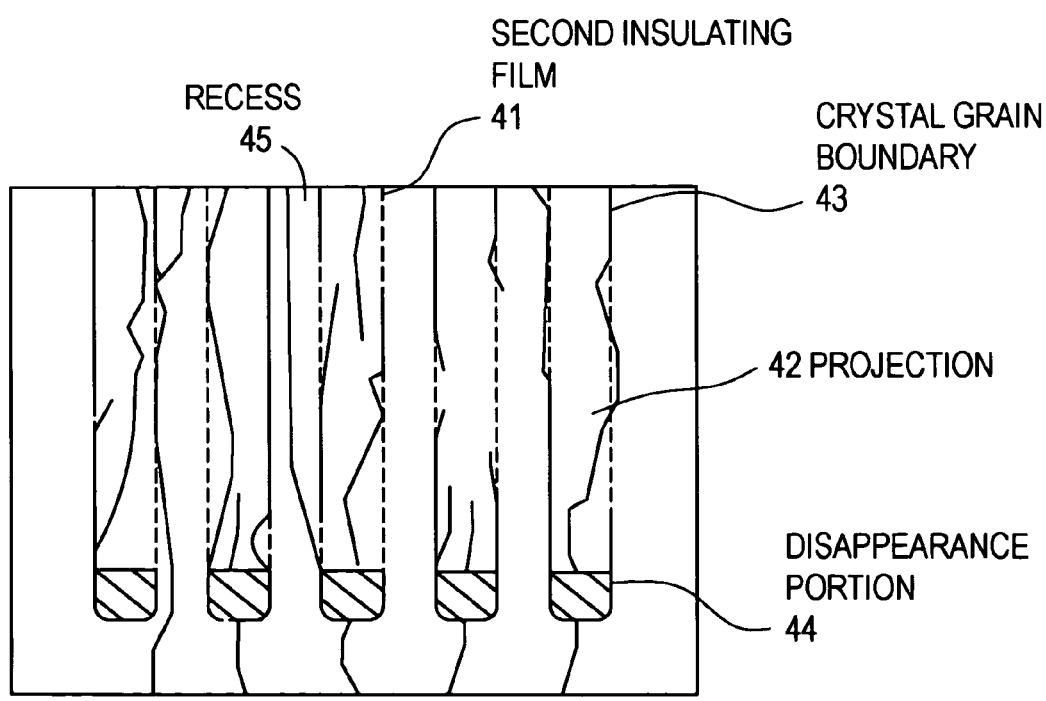

Also, FIG. 24B is a schematic diagram of the photograph of FIG. 24A. In this figure, numeral 41 denotes an insulating film (the second insulating film) extending in linear stripe pattern. Situation that the crystal grain boundary 43 exposed by secco etching and intensively collected in projection 42 can be checked. In addition, region 44 indicated to be a disappearance portion is a region equivalent to the starting point of the stripe pattern, and for the above-described reason, disappeared by secco etching. In addition, if contrasted with the photograph shown in FIG. 24A, a crystal grain boundary is generated not only in projection 42 in stripe pattern but also in recess 45.

Figure 5E:
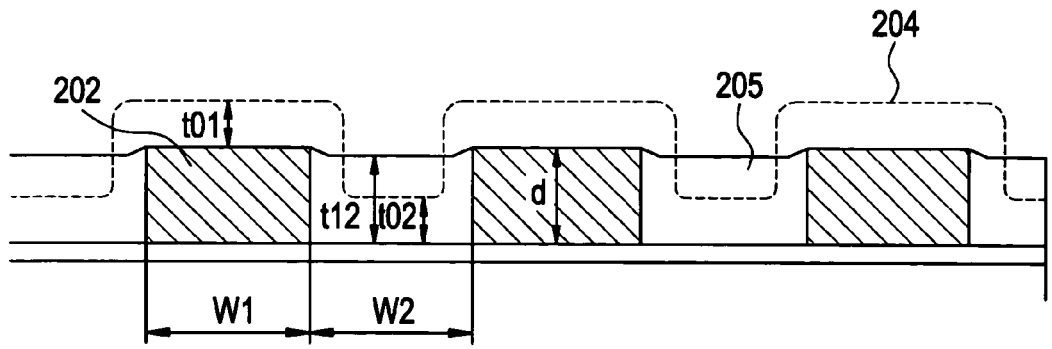
Figure 6A:
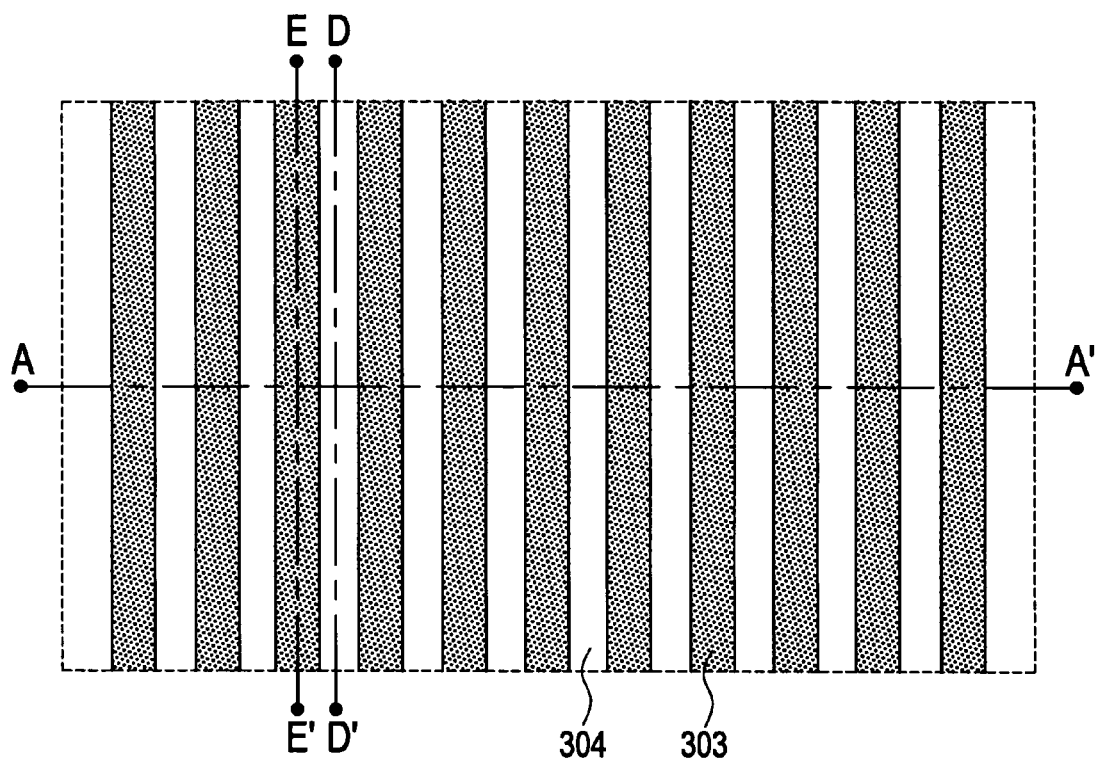
FIGS. 6A to 6D are a top view and longitudinal sectional views explaining a manufacture process of a transistor of this invention.
Figure 6B:
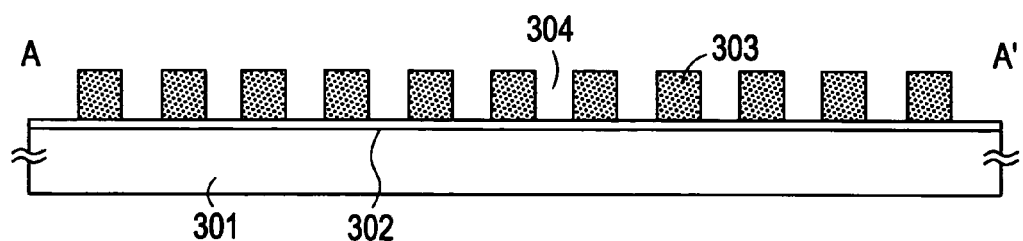
Figure 6C:
Figure 6D:
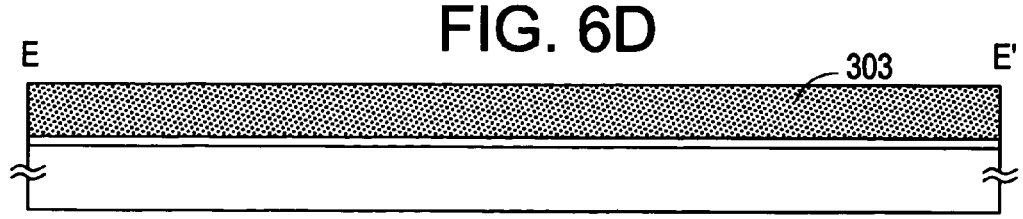
Figure 7A:
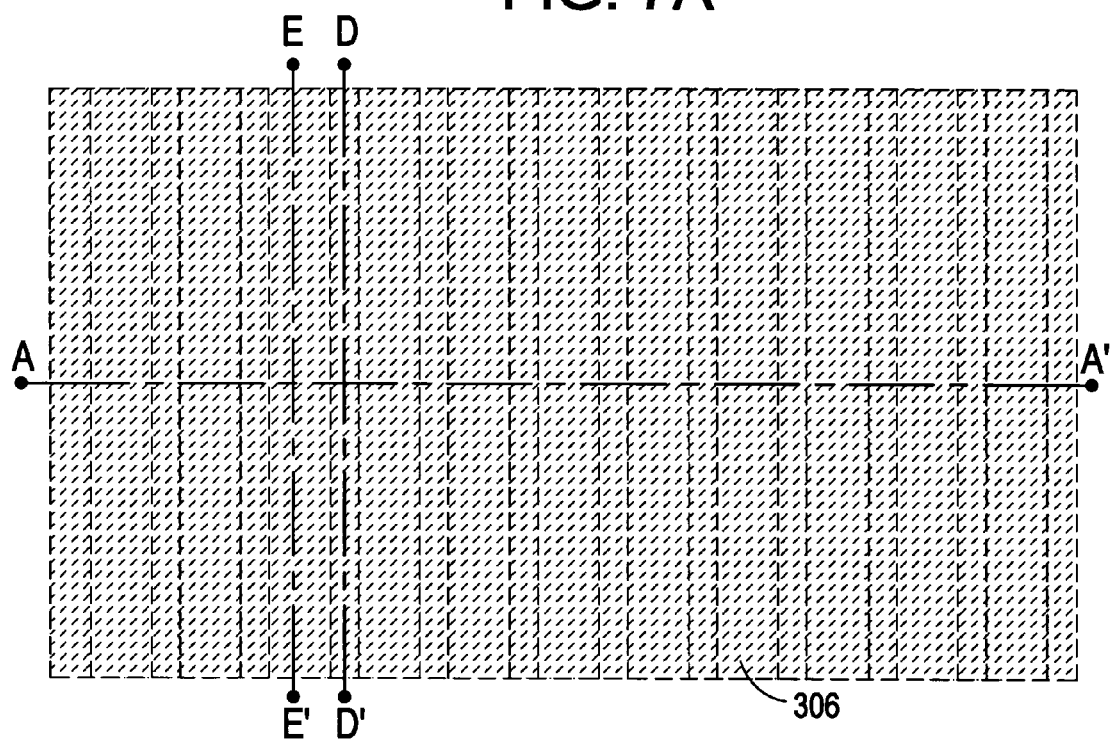
FIGS. 7A to 7D are a top view and longitudinal sectional views explaining the manufacture process of a transistor of this invention.
Figure 7B:
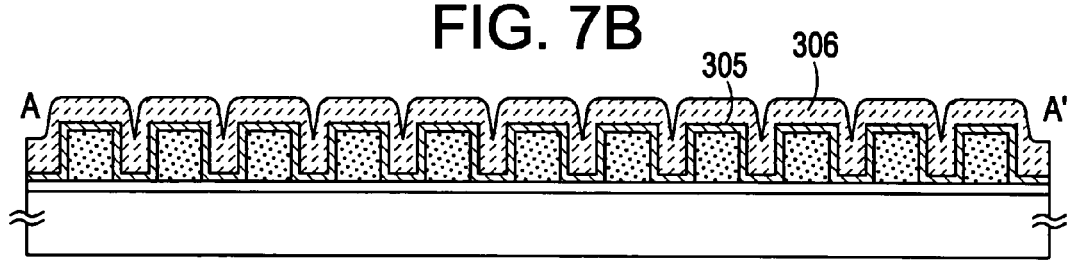
Figure 7C:
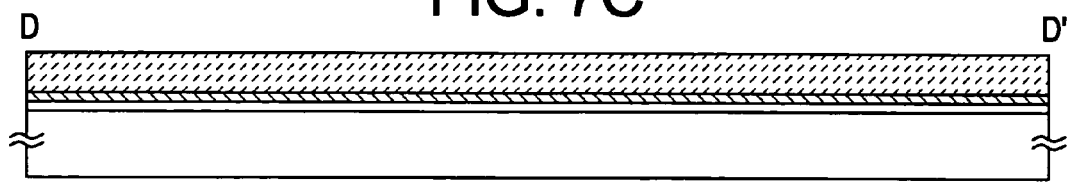
Figure 7D:
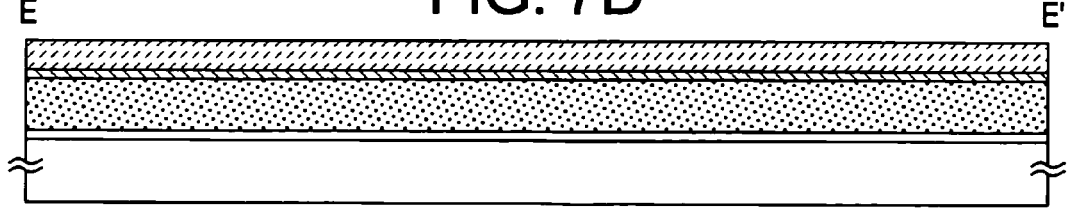
Figure 8A:
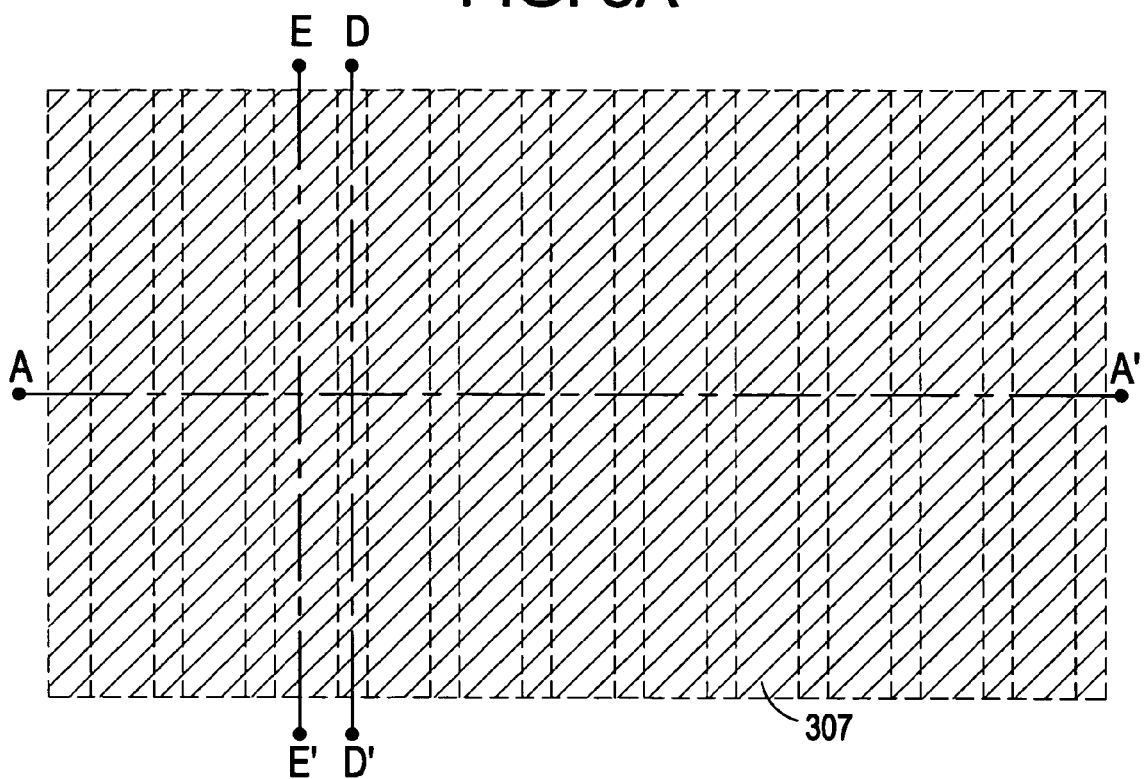
FIGS. 8A to 8D are a top view and longitudinal sectional views explaining the manufacture process of a transistor of this invention.
Figure 8B:
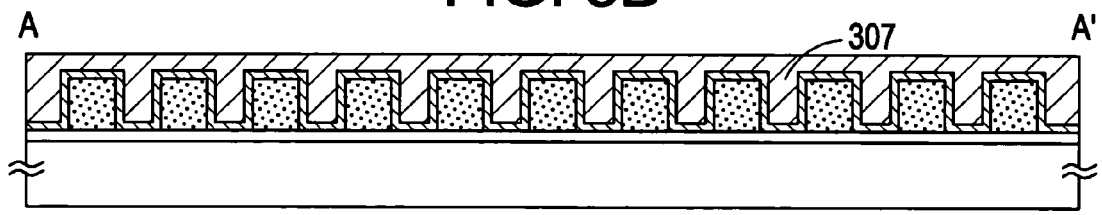
Figure 8C:
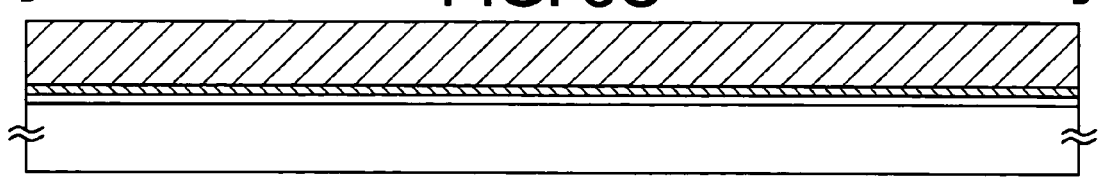
Figure 8D:
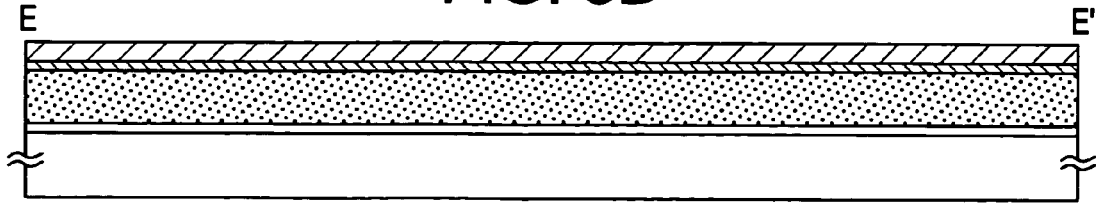
Figure 9A:
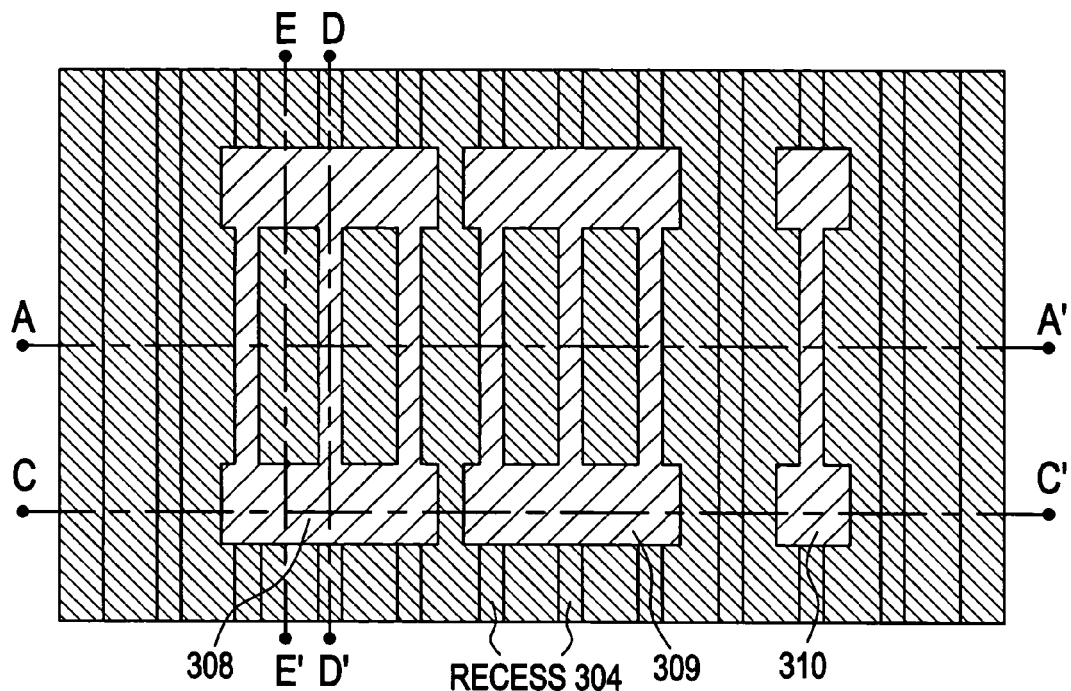
FIGS. 9A to 9E are a top view and longitudinal sectional views explaining the manufacture process of a transistor of this invention.
Figure 9B:
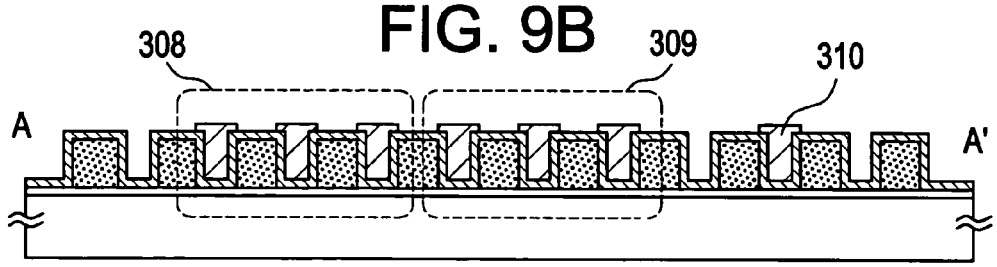
Figure 9C:
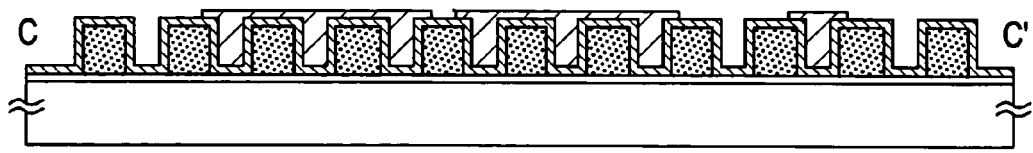
Figure 9D:
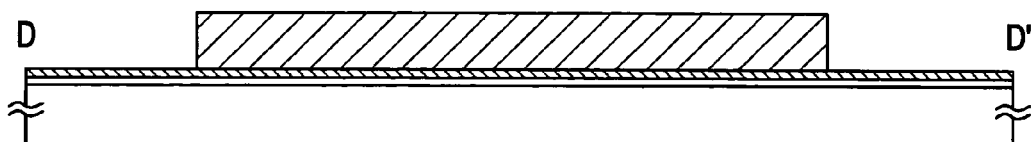
Figure 9E:
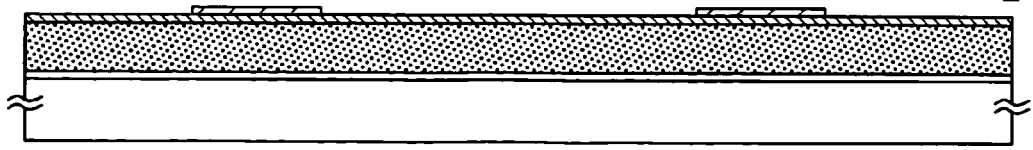
Figure 10A:
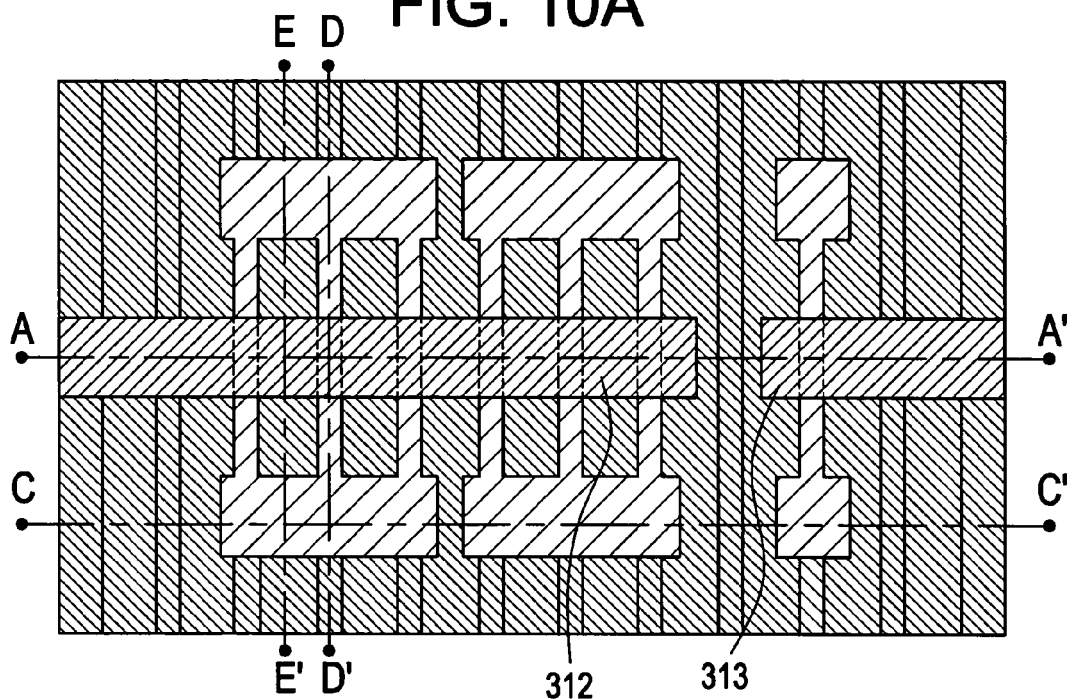
FIGS. 10A to 10E are a top view and longitudinal sectional views explaining the manufacture process of a transistor of this invention.
Figure 10B:
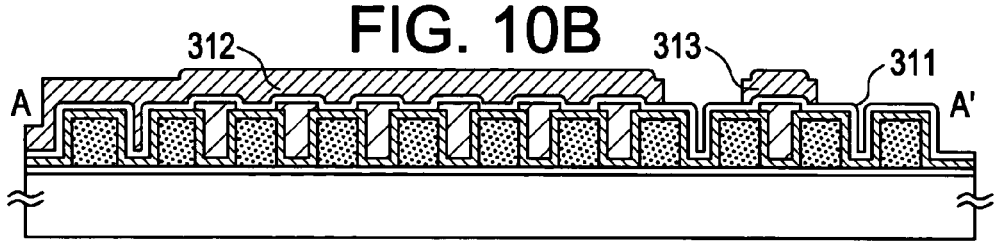
Figure 10C:
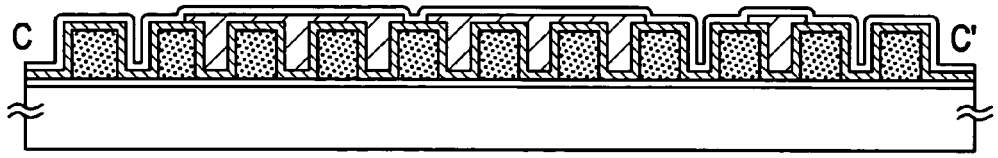
Figure 10D:
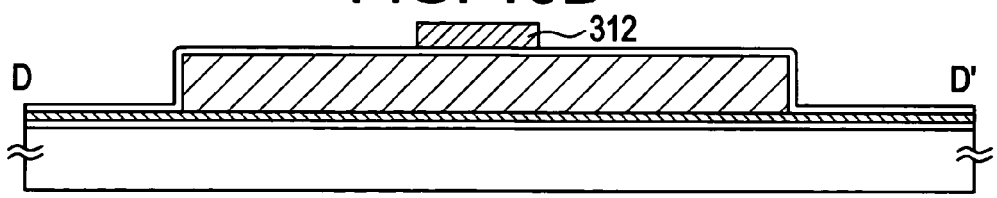
Figure 10E:
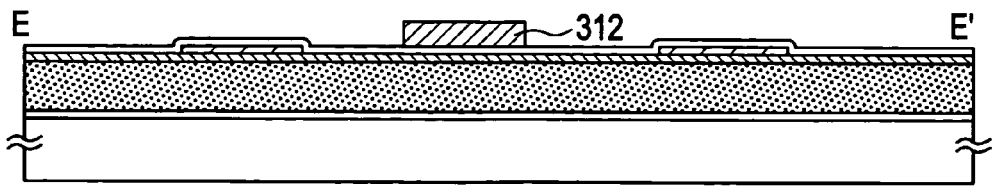
Figure 11A:
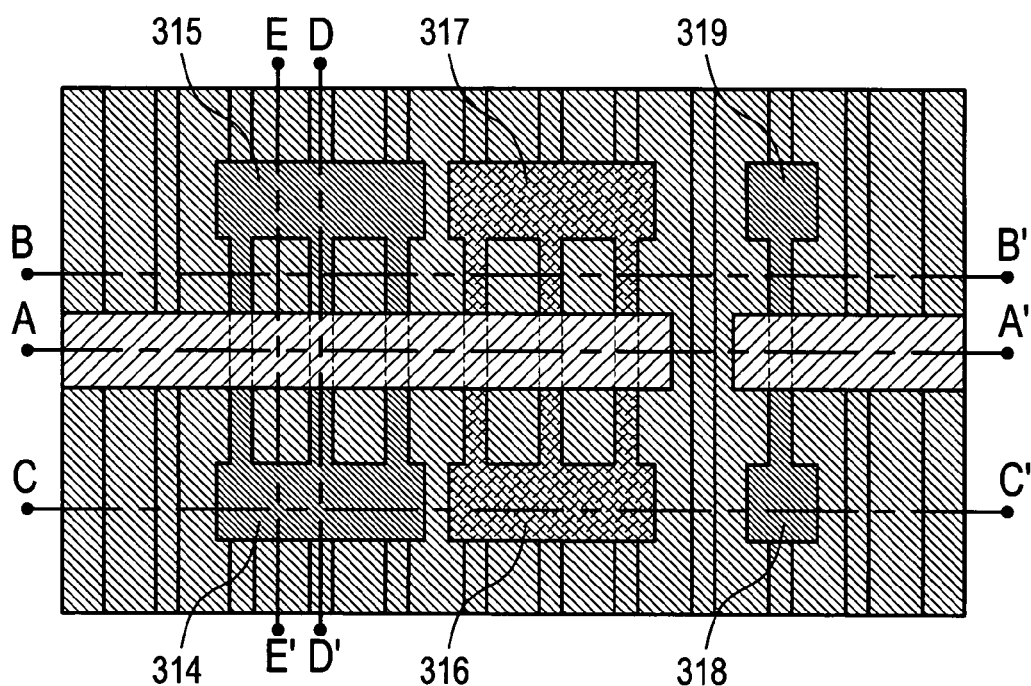
FIGS. 11A to 11F are a top view and longitudinal sectional views explaining the manufacture process of a transistor of this invention.
Figure 11B:
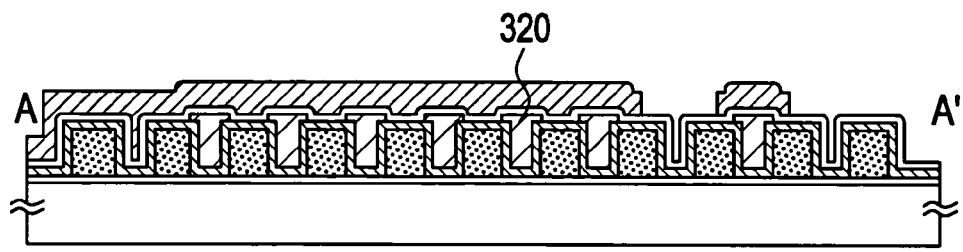
Figure 11C:
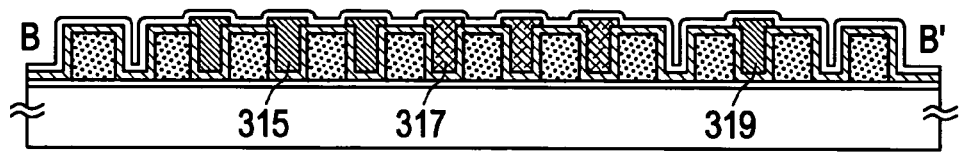
Figure 11D:
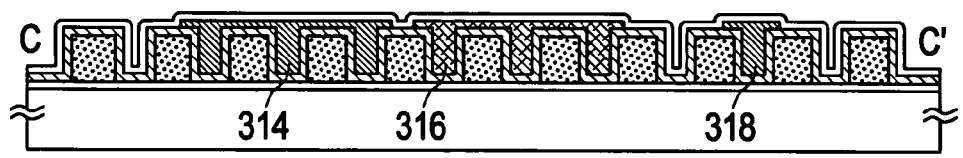
Figure 11E:
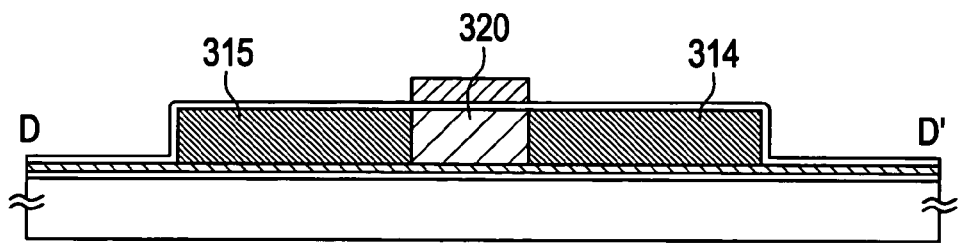
Figure 11F:
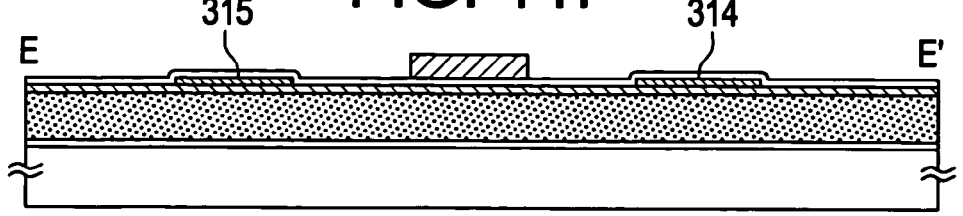
Figure 12A:
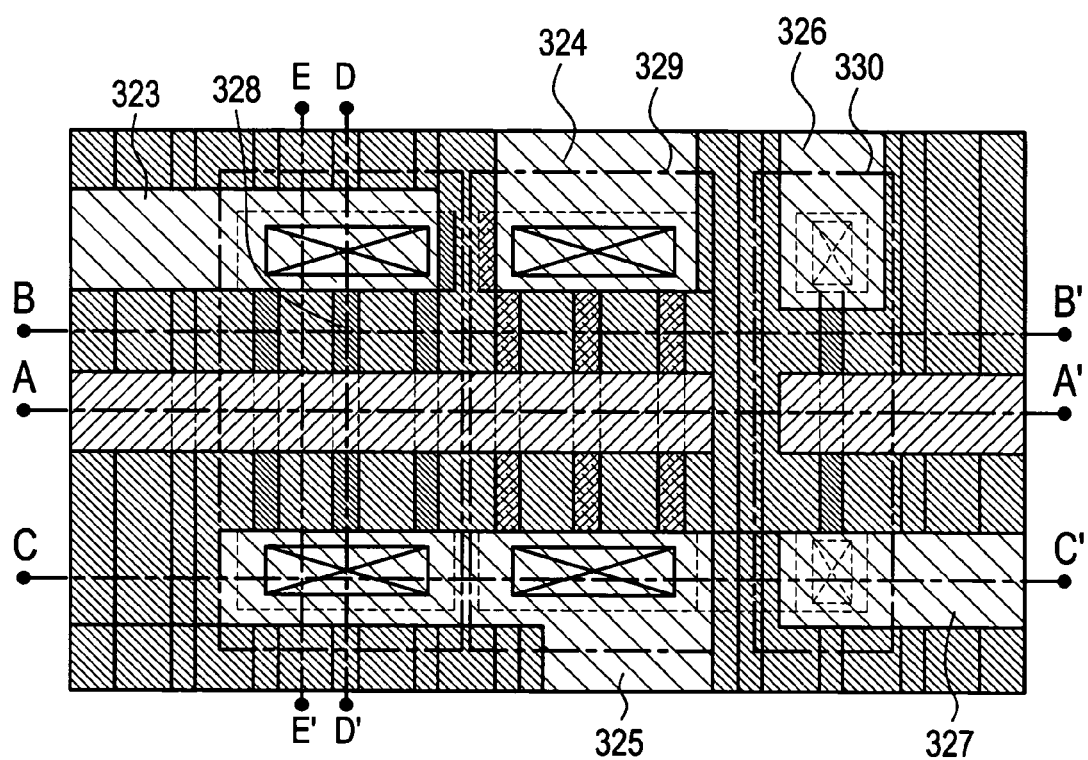
FIGS. 12A to 12F are a top view and longitudinal sectional views explaining the manufacture process of a transistor of this invention.
Figure 12B:
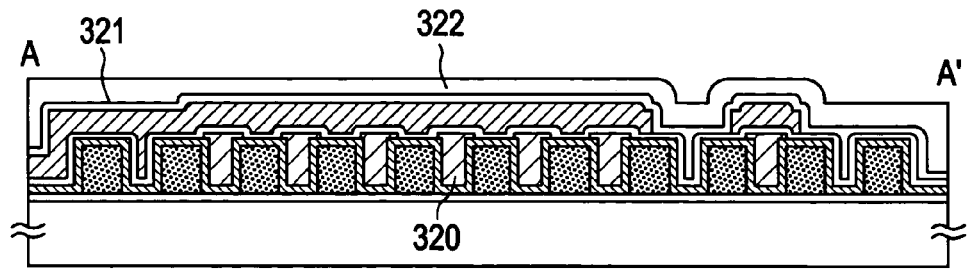
Figure 12C:
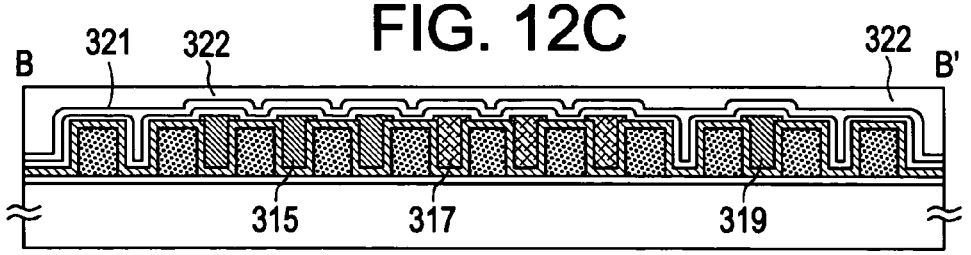
Figure 12D:
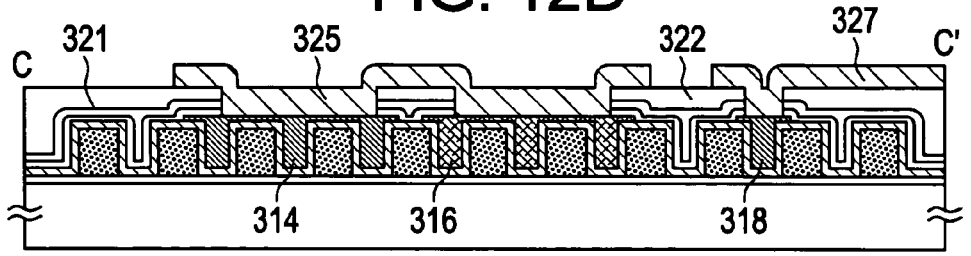
Figure 12E:
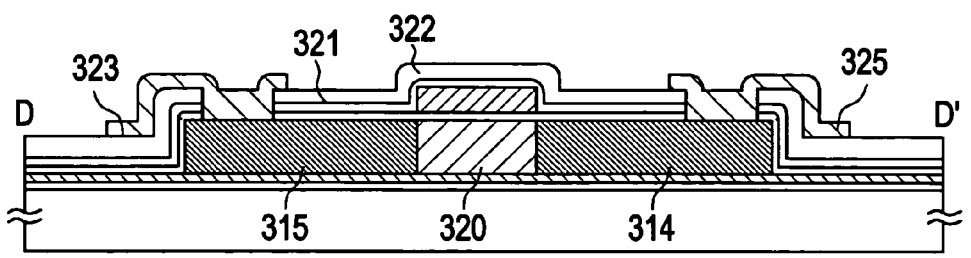
Figure 12F:
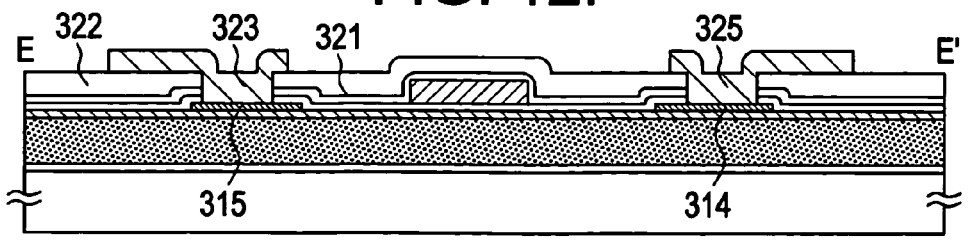

FIG. 5E is a referential example in this invention, showing the case where $d \gg t02$, and W1, W2 are 1 µm or less. Namely, when thickness d of the second insulating film is too thick compared with thickness t02 of the amorphous semiconductor film in recesses, formation is made in such a way that the recesses are filled up with the crystalline semiconductor film 204, hardly remaining on the second insulating film 203. Therefore, the crystalline semiconductor film on the second insulating film cannot be used as this invention shows, as a contact part of a source region and a source electrode (or a drain region and a drain electrode).

As described above, and as explained using FIG. 5A to FIG. 5D, when a semiconductor element is formed, especially when a channel formation region in a thin-film transistor is formed, the form of FIG. 5B is considered to be most suitable. Namely, putting in another way, when subjected to secco etching over the secco-solution, it is preferable to use the crystalline semiconductor film with crystal grain boundary and a defect hardly exposed, or to use the crystalline semiconductor film without substantial crystal grain boundary and a defect, for channel formation regions.

Also, as irregular form of the ground material constituting the crystalline semiconductor film, an example formed by a first insulating film and a second insulating film was shown here. However, it is not construed as limited thereto, but can be substituted if assuming the similar form. For example, an insulating film with thickness of about 200 nm to 2 μm may be subjected to etching, and the recesses of the desired depth may be formed.

In addition, at the time of the crystallization process, the effect that the second insulating film eases the stress by contraction of the semiconductor film can be expected in case the second insulating film is a soft insulating film (Low density insulating film), as described above. On the contrary, in case of a hard insulating film (High density insulating film), stress occurs so as to oppose the contraction or expansion of the semiconductor film. Therefore, stress deviation after crystallization is likely to be left, causing a crystal defect. For example, with well-known Graphoepitaxy use ("M. W. Geis, D. C. Flanders, H. I. Smith: Appl. Phys. Lett. 35 (1979) pp 71"), irregularities on a substrate is directly formed by hard quartz glass. In this case, it becomes clear that orientation axis of crystal Si is a [100] axis, and main orientation axis is {100} surface.

However, when performing this invention, as shown in FIG. 25, main orientation is {110}, and it becomes clear that the semiconductor films with different crystal forms are formed. The different crystal form occurs on a soft insulating film with irregularities on a substrate formed by CVD method and PVD method. That is, the stress that can occur in the case of crystallization could be eased more, or the stress could be centralized on the crystalline semiconductor film on projections, by making the second insulating film serving as a ground material in softer quality than quartz glass.

In addition, a softer insulating film than quartz glass is intended to be an insulating films with quicker etching rate than general quartz glass for example (quartz glass industrially used as a substrate), or an insulating film with high hardness. The quartz glass was subjected to wet etching, defining the mixed solution of 7.13% of ammonium bifluoride ($NH_4HF_2$) and 15.4% of ammonium fluoride ($NH_4F$) (Stella Chemifa Corporation product. Brand name is LAL500) as etchant. The result showed that etching rates of the quartz substrate was 38 nm/min. On the other hand, the etching rates by the above etchant of the second insulating film serving as the ground material is 50 to 1000 nm/min. This shows that a softer insulating film than the quartz glass is made. Since such etching rates or hardness is decided by relative comparison with quartz glass, it is not dependent on the measurement conditions of etching rates, or the measurement conditions of hardness.

If silicon oxynitride film is used as the second insulating film for example, the Silicon oxynitride film formed by plasma CVD method using $SiH_4$ gas and $N_2O$ gas as materials is preferable. The etching rate of the Silicon oxynitride over mixed solution containing 7.13% of ammonium bifluoride ($NH_4HF_2$) and 15.4% of ammonium fluoride ammonium ($NH_4F$) at 20° C. is 110 to 130 nm/min (500° C., 1 hour+550° C. and 90 to 100 nm/min after heat treatment of 4 hours.)

Also, when a silicon nitrioxide film is used as a second insulating film, plasma CVD method using $SiH_4$ gas ($SiH_4$), $NH_3$ gas, and $N_2O$ gas as materials is preferably chosen as a formation method thereof. The etching rate of the Silicon oxynitride over mixed solution containing 7.13% of ammonium hydrogen bifluoride ($NH_4HF_2$) and 15.4% of ammonium fluoride ($NH_4F$) at 20° C. is 60 to 70 nm/min (500° C., 1 hour+550° C. and 40 to 50 nm/min after heat treatment for 4 hours.)

As described above, the linear stripe pattern having recesses and projections is formed by an insulating film, and an amorphous semiconductor film is deposited thereon. Then by irradiating laser beams to cause melting state followed by crystallization, a semiconductor is poured in the recesses and solidified. Thereby, deviation or stress accompanying crystallization can be centralized on regions other than recesses, and the region with bad crystallizability such as crystal grain boundary can be alternatively formed. And a semiconductor region with good crystallizability is defined as a region where carrier movement of such as the channel formation region of a thin-film transistor is performed, and a semiconductor region with bad crystallizability is used as a contact part with an electrode.

That is, the crystalline semiconductor film having pluralities of crystal orientations in recesses and pluralities of gathered crystal grains extending in the direction parallel to the direction where linear stripe pattern extends can be formed, without forming a crystal grain boundary. By forming a transistor so that channel formation regions may be arranged by such crystalline semiconductor films, a semiconductor device constituted by a transistor capable of high-speed operation, with high current drive capability and little variation in pluralities of elements or its transistor group can be formed.

Embodiment 2

As formation method of the crystalline semiconductor film of this invention, as shown in the embodiment 1, melt-recrystallization may be satisfactory by irradiating laser beams further after crystallization by solid phase growth, other than the method which irradiates laser beams onto an amorphous semiconductor film to obtain crystallization.

For example, after amorphous semiconductor film 106 is formed in FIG. 2, nickel is doped as metallic elements with catalyst action to promote crystallization in such a way that crystallization temperature of the amorphous semiconductor film (for example, amorphous silicon film) is lowered, and orientation quality is raised.

This technology is detailed in JP-A-11-354442 by this applicant. The crystalline semiconductor film formed by doping nickel defines the main orientation as surface {110}. If such crystalline semiconductor films are used for the channel formation regions of a thin-film transistor, both electronic degree of movement and hole degree of movement improve significantly, with the result that degree of electric field effect movement of a N channel transistor and a P channel transistor improve as well. Especially improvement in the electric field effect of the P channel transistor accompanying improvement in the hole degree movement is highly important. This is one of the advantages in setting main orientation surface to {110}.

Moreover, the method of doping nickel is not limited, and such as spin coating method, deposition method, and sputtering method can be applied. When based on the spin coating method, 5 ppm solution of acetic acid nickel salt is coated to form a metallic-elements content layer. Of course, a catalyst element is not limited to nickel but other well-known material may be used.

Then, amorphous semiconductor film 106 is crystallized by heat treatment for 4 hours at 580° C. Laser beams or a strong light equivalent to the laser beams is irradiated onto this crystallized semiconductor film, so as to cause melting state and re-crystallization. In this way, the crystalline semiconductor with substantially planarized surface can be obtained in a similar manner as shown in FIG. 3. This crystalline semiconductor film similarly has a region where growth end or crystal grain boundary 110 is formed.

The advantage of using a crystallized semiconductor film as an irradiating object by laser beams is the variation ratio of the optical absorption coefficient of the semiconductor film. Even if laser beams are irradiated onto the crystallized semiconductor film to cause melting state, an optical absorption coefficient is hardly changed. Therefore, large margin of laser irradiation conditions can be specified.

In this way, metallic elements remain on the formed crystalline semiconductor film, but can be removed by gettering. This technology is detailed in Patent Application No. 2001-019367 (or Patent Application No. 2002-020801) for reference. Moreover, the heat-treatment accompanying this gettering also has the effect of easing deviation of the crystalline semiconductor film.

Then, as similar to the embodiment 1, a-thin-film transistor defining a crystalline semiconductor film of recesses as a channel formation region and defining a crystalline semiconductor film of projections as a source region or a drain region is formed. The crystalline semiconductor films of projections has a plurality of crystal orientations, having no grain boundary formed thereon. Therefore, a transistor with highly current drive capability and little variations in pluralities of elements and also capable of high-speed operation, or the transistor group can be formed.

Embodiment 3

Next, one mode of manufacturing a transistor will be explained in conjunction with the drawings. This transistor includes a crystalline silicon film formed on a ground insulating film with recesses and a channel formation region arranged in the semiconductor region which is formed in the recesses. In addition, in each drawing of this embodiment, (A) is a top view and (B) et seq. is a longitudinal cross section showing each part corresponding to (A).

In FIG. 6, first insulating film 302 consisting of 30 to 300 nm silicon nitride, silicon oxynitride with a bigger nitrogen content than an oxygen content, aluminum nitride, or aluminum oxynitride is formed on glass substrate 301. Linear stripe pattern having recesses and projections on the first insulating film 302 is formed by the second insulating film 303 consisting of silicon oxide or silicon oxynitride. The silicon oxide is subjected to plasma CVD method, wherein TEOS and $O_2$ are mixed, the reaction pressure of 40 Pa and the substrate temperature of 400° C. are set, so as to be discharged with high frequency (13.56 MHz), electric power density 0.6 W/cm$^2$, deposing in 10 to 3000 nm, more preferably in 100 to 2000 nm. Then recess 304 is formed by etching. In the place where a channel formation region is arranged especially, the recesses are formed with width setting to 0.01 to 1 μm, preferably 0.05 to 0.2 μm.

Next, as shown in FIG. 7, the third insulating film 305 consisting of oxidation film and silicon oxynitride film, and the amorphous silicon film 306 are formed continuously on the first insulating film 302 and the second insulating film 303 using the same plasma CVD apparatus and without exposing to an atmosphere. The amorphous silicon film 306 is formed by the semiconductor film containing silicon as the main composition, and formed by the plasma CVD method using $SiH_4$ as material gas. In this stage, as shown in the figure, the bottom and the flank side of recess 304 are covered, presenting the surface which is not flat.

Irradiating continuous oscillator laser beams causes crystallization. The state after the crystallization is shown in FIG. 8. Conditions of crystallization is determined in such a way that using the $YVO_4$ laser oscillator of continuous oscillation mode, in an optical system, outputs 5 to 10 W of the second harmonic wave (wavelength 532) are condensed in linear laser beams setting longitudinal ratio to an orthogonal direction as 10 or more, or condensed so that uniform energy density distribution may be obtained in the lengthwise direction. This causes crystallization, scanning at a rate of 5 to 200 cm/sec. The uniform energy density distribution is not intended to eliminate all but a completely fixed one. The range permitted in the energy density distribution is ±10%.

As for the strength distribution of the laser beams linearly condensed, it is preferable that the strength distribution is longitudinally uniform (in the X-axis direction in FIG. 3). This is for obtaining a uniform temperature of the semiconductor to be heated over the whole surface of the irradiation region of the laser beams. If a temperature distribution arises in the X-axes direction of the linearly condensed laser beams, it becomes impossible to specify the direction of crystal growth of a semiconductor film in the scanning direction of the laser beams. By arranging a linear stripe pattern so as to be united with the scanning direction of the irradiation region of the linearly condensed laser beams, the growth direction of a crystal and the direction of channel length of all transistors can be united. Thereby, variations in pluralities of elements of a transistor can be made small.

Also, crystallization by the linearly condensed laser beams may be completed by only one scan (namely, one direction), or both-way scan may be performed in order to raise crystallizability more. Furthermore, after crystallization by laser beams, the surface of a silicon film is processed with alkali solution, such as oxide removal by such as hydrofluoric acid or ammonia hydrogen peroxide solution processing, portion of bad quality with a quick etching speed is removed alternatively, and same crystallization processing may be performed again. Thus, crystallizability can be raised.

By irradiating laser beams on this condition, an amorphous semiconductor film is melted momentarily and crystallized. Substantially, while a melting region moves, crystallization advances. The melted silicon is condensed and solidified in recesses under the influence of surface tension. By the above, crystalline semiconductor film 307 with flat surface is formed so that recess 304 may be filled up with, as shown in FIG. 8.

Then, as shown in FIG. 9, crystalline semiconductor film 307 is subjected to etching, and semiconductor film regions 308 to 310 used as the active layer of a thin-film transistor are formed. In addition, the forms of the semiconductor regions 308 to 310 are not limited to FIG. 9, and especially not limited within the limits according to a predetermined design rule as described in the embodiment 1.

By using the gas and oxygen of a fluoride system as etching gas, crystalline semiconductor film 307 and third insulating film 305 can be subjected to etching selectively. Of course, even if third insulating film 305 was subjected to etching, when selectivity of the first insulating film 302 disposed under the third insulating film 305 and the second insulating film 303 can be secured, it is satisfactory in any way.

In addition, as an etching method, plasma-etching method using the mixed gas of $CF_4$ and $O_2$, and $NF_3$ gas may be adopted. Or plasma-less gas etching using fluoridation halogen gas, such as $ClF_3$ gas without exciting may be adopted also. The plasma-less gas etching is an effective method. The reason is that plasma damage does not occur to a crystalline semiconductor film, and crystal defects can be controlled.

Next, as shown in FIG. 10, fourth insulating film (functioning as a gate insulating film) 311 and conductive films 312 and 313 used for a gate electrode are formed so that top surface of the semiconductor regions 308 to 310 and second insulating film 303 may be covered. Fourth insulating film 311 may be consisted of either of silicon oxide film, silicon nitride film, silicon oxynitride film, silicon nitrioxide, aluminum nitride film, aluminum nitrioxide, aluminum oxynitride, or aluminum oxide. Or laminated films combining these films may be satisfactory.

In order to improve coverage of a gate insulating film, silicon oxide film using TEOS is preferably used. Using aluminum nitrioxide formed by the RF sputtering method may also be used. Or the laminated films of these aluminum nitrioxide film and silicon oxide (silicon oxide film may satisfactorily be formed in such a way that a semiconductor film serving as an active layer is oxidized by hydrogen peroxide.) are satisfactory.

Moreover, the electric conductive films 312 and 313 used as a gate electrode are formed by tungsten, the alloy containing tungsten, or aluminum or an aluminum alloy.

Next, as shown in FIG. 11, one-conductivity-type impurity fields 314 to 319 are formed in semiconductor regions 308 to 310. Here, n type impurity fields 314, 315, 318, and 319 and p type impurity fields 316 and 317 are formed for convenience. Electric conductive films 312 and 313 may be formed self-aligned in these impurity fields as masks, or may be formed by masking using a photoresist. Source or drain regions may also be formed in the impurity fields 314 to 319. Low density drain regions (generally referred to as LDD regions.) can also be provided if-needed.

As the impurity fields 314 to 319, ion implantation where impurity ions are accelerated by electric field to be poured into semiconductor regions or ion doping is applied. In this case where this invention is applied, the existence of mass separation of the ion kind to pour in does not pose an essential problem.

At this time, semiconductor region 320 of semiconductor regions 308 to 310, disposed under gate electrodes 312 and 313 and formed in recess 304, is intended to serve as a channel formation region of a thin-film transistor of this invention.

And fifth insulating film (functioning as a passivation film.) 321 by silicon nitride film or silicon oxynitride film containing about 50 to 100 nm hydrogen as shown in FIG. 12 is formed. By heat-treating at 400 to 450° C. in this state, hydrogen contained in silicon nitride film or silicon oxynitride film is emitted, and the hydrogenation can be performed over an island-shaped semiconductor film.

Subsequently, sixth insulating film (functioning as an interlayer insulating film.) 322 is formed by silicon oxide film and others, and wiring 323 to 327 linked to impurity fields 314 to 319 is formed. In this way, n channel type transistors 328 and 330 and p channel type transistor 329 can be formed.

Multi-channel type transistor which has pluralities of channel formation regions 320 arranged in parallel, and connected between a pair of impurity fields 314 and 315 (or 316 and 317) is shown by n channel type transistor 328 and p channel type transistor 329 as shown in FIG. 12. Specifically, inverter circuit serving as a basic circuit of CMOS structure is constituted from the n channel type multi-channel transistor 328 and the p channel type multi-channel transistor 329, and one of this example is shown. The number of the channel formation regions arranged in parallel in this constitution is not limited, but pluralities of numbers may be arranged if needed. For example, a single channel like the n channel type transistor 330 may also be satisfactory.

Embodiment 4

A transistor is shown by single drain structure in embodiment 3. However, low-density drain (LDD) may also be provided. FIG. 13 is a view showing an example of the n channel type multi-channel transistor with LDD structure.

Figure 13A:
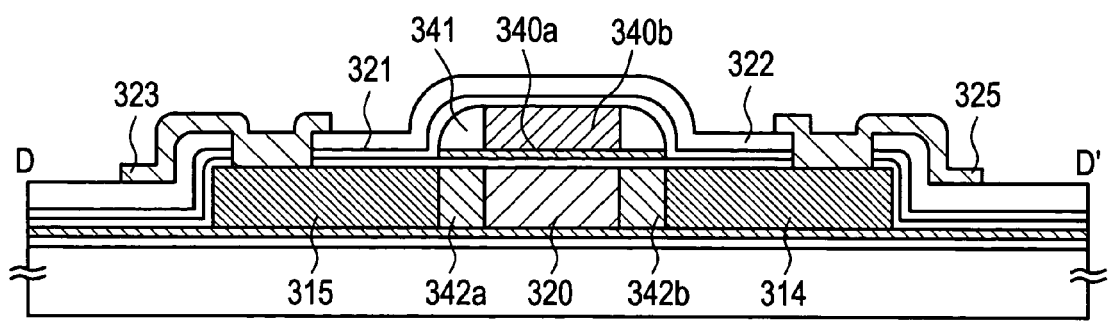
FIGS. 13A to 13C are longitudinally sectional views showing an example of a gate structure applicable in a transistor of this invention.

The structure of a transistor shown in FIG. 13A is an example of forming a gate electrode by nitride metal 340a such as titanium nitride or tantalum nitride, and metal 340b of high melting point such as tungsten, or tungsten alloy. And spacer 341 is formed in the flank side of the gate electrode 340b. Spacer 341 may be formed with either insulators such as silicon oxide or n type multi-crystal silicon in order to give conductivity, and formed by anisotropic dry etching. LDD regions 342a and 342b can be formed self-aligned to gate electrode 340b, before this spacer is formed. When a spacer is formed with a conductive material, LDD regions 342a and 342b can be structured as Gate-Overlapped LDD structure substantially superimposed on a gate electrode.

Figure 13B:
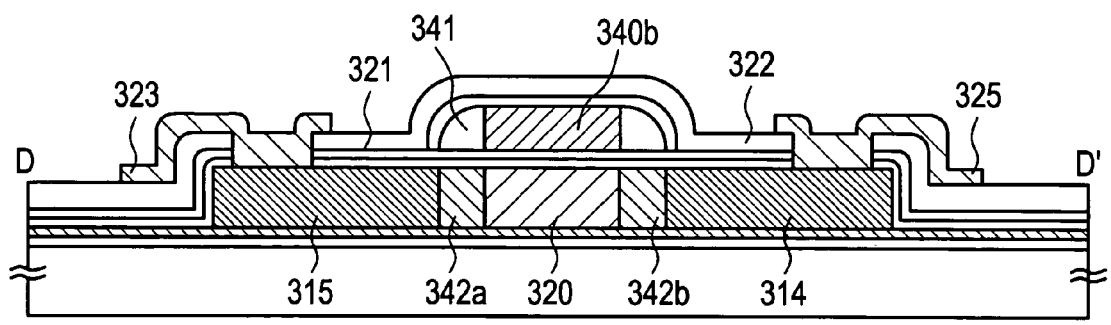
Figure 13C:
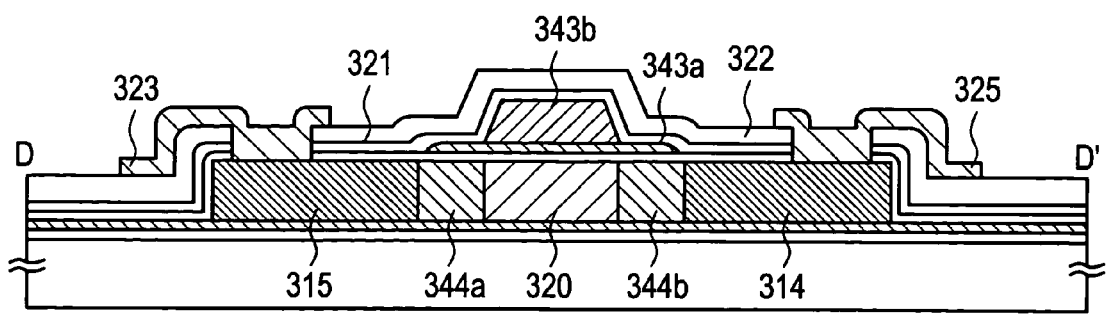

On the other hand, FIG. 13B is the structure where gate electrode 340a is not prepared, and serves as LDD structure in this case.

The n type impurity field 344 forming LDD regions adjoining to n type impurity field 315 is formed. Gate electrode 343 is a two-layer structure of under layer side gate electrode 343a and upper layer side gate electrode 343b. And n type impurity fields 314 and 315 and LDD regions 344a and 344b can be formed self-alignedly. Details of such a gate electrode and fields, and its manufacturing method are disclosed in Patent Application No. 2000-128526, or Patent Application No. 2001-011085 for reference.

Anyway, especially the structure that forms LDD regions in self-aligned according to such gate structure is effective for a design rule to be made finer. The transistor unipolar structure is shown here, and CMOS structure as well as the embodiment 4 can also be formed.

In addition, in this embodiment, explanation for the same constitution with the embodiment 3 other than a gate electrode and LDD regions is omitted to simplify the overlapped explanation.

Embodiment 5

This embodiment relates to the invention different from the constitution explained in the embodiment 1, wherein the impurity field of one conductivity type which functions as an electrode is used as it is, as wiring also. This embodiment aims at improvement in the yield while reducing the number of contact parts and aims at improvement in the scale of integration by reduction of a design margin.

Figure 14A:
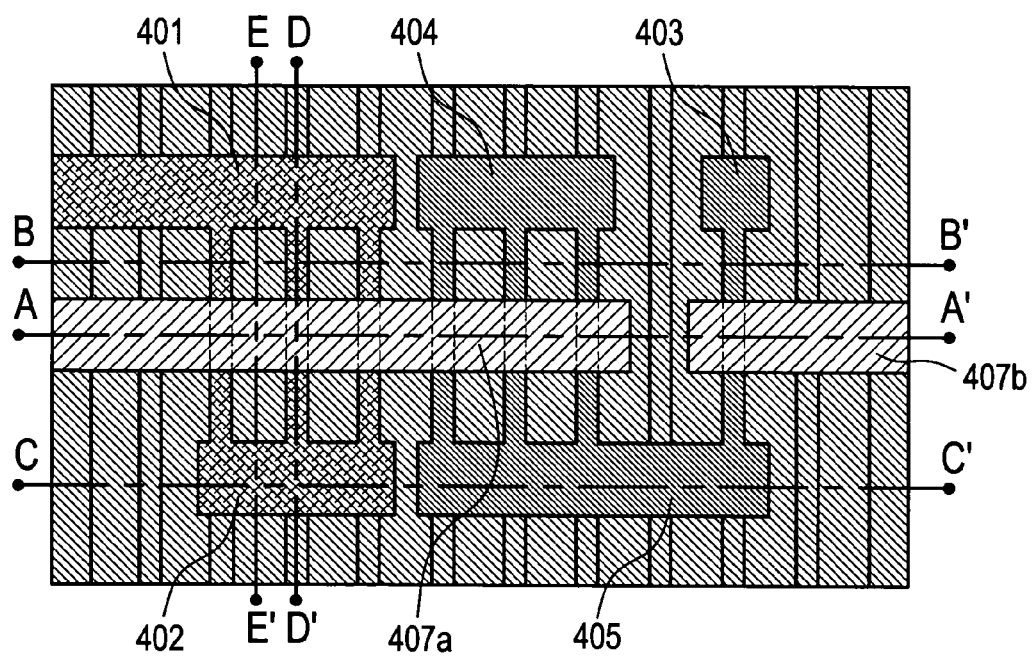
FIGS. 14A to 14F are a top view and longitudinally sectional views explaining the manufacture process of a transistor of this invention.
Figure 14B:
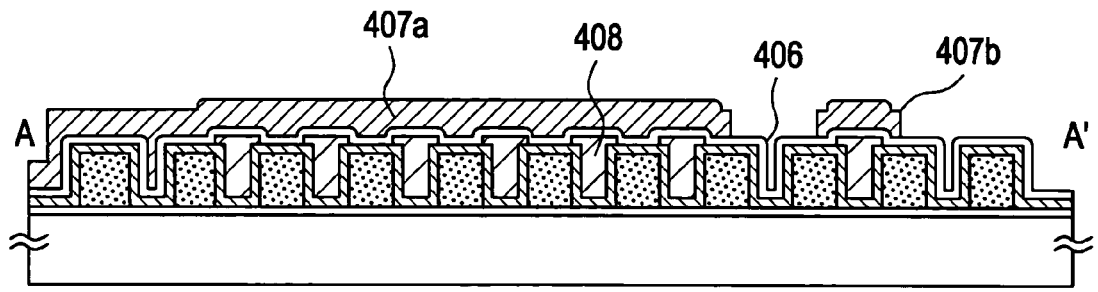
Figure 14C:
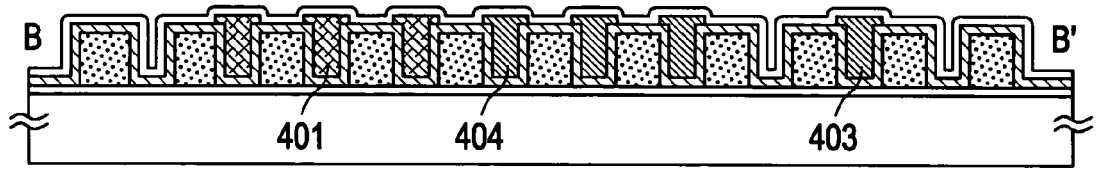
Figure 14D:
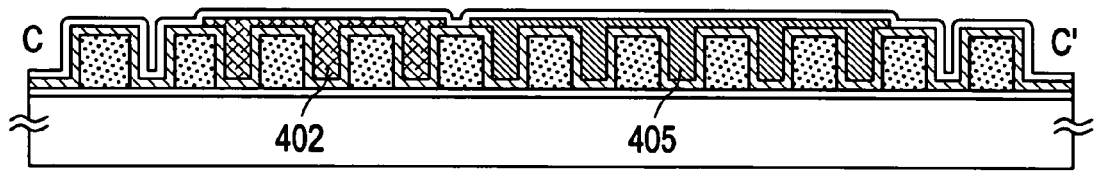
Figure 14E:
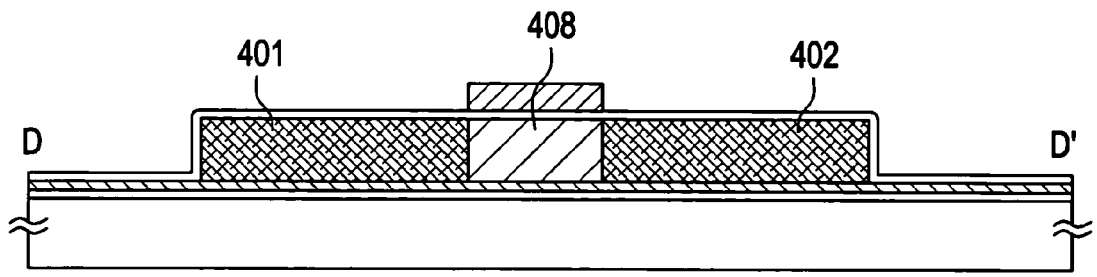
Figure 14F:
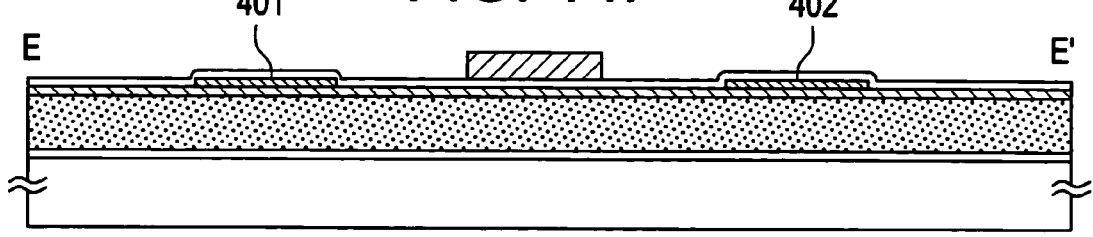

Explanation will be given using FIG. 14. FIG. 14A is a top view, and FIG. 14B to FIG. 14F are cross-sectional views showing the respective parts. In addition, it is a view corresponding to the state shown in FIG. 11 in the embodiment 1. The process which results in this state and a subsequent transistor formation process are shown in the embodiment 1 for reference.

In FIG. 14A, 401 to 405 function as impurity fields of one conductivity type, numerals 401 and 402 function as source regions and drain regions of a P channel type transistor, respectively. Further, numerals 403 and 404 function as the source regions of the N channel type transistor, respectively, and numeral 405 functions as a drain region of a N channel type transistor. At this time, drain region 405 functions as wiring which connects two transistors electrically.

Since a crystalline semiconductor region with bad crystallizability is also utilizable as an electrode in this invention, the number of contact parts can be reduced by utilizing as wiring like this embodiment. In addition, a design margin for contact formation can be extended. Therefore, it is very effective to form the logic circuit which is especially made finer.

In addition, this embodiment is only an example and proposes a technical thought that the impurity fields of a conductivity type can be used not only as an electrode but also as wiring in this invention. Accordingly, combining with any technology disclosed in embodiments 1 to 4 makes it possible to obtain the effect described in these embodiments.

Embodiment 6

The embodiment of this invention is different from the constitution explained in the embodiment 1, and relates to the invention wherein a plurality of transistors are formed to be connected in series by using a conductive type impurity region as wiring. This embodiment makes it possible to obtain a transistor having a plurality of channel formation regions between a sauce region and a drain region, and shows possibilities of further embodiments.

Figure 15A:
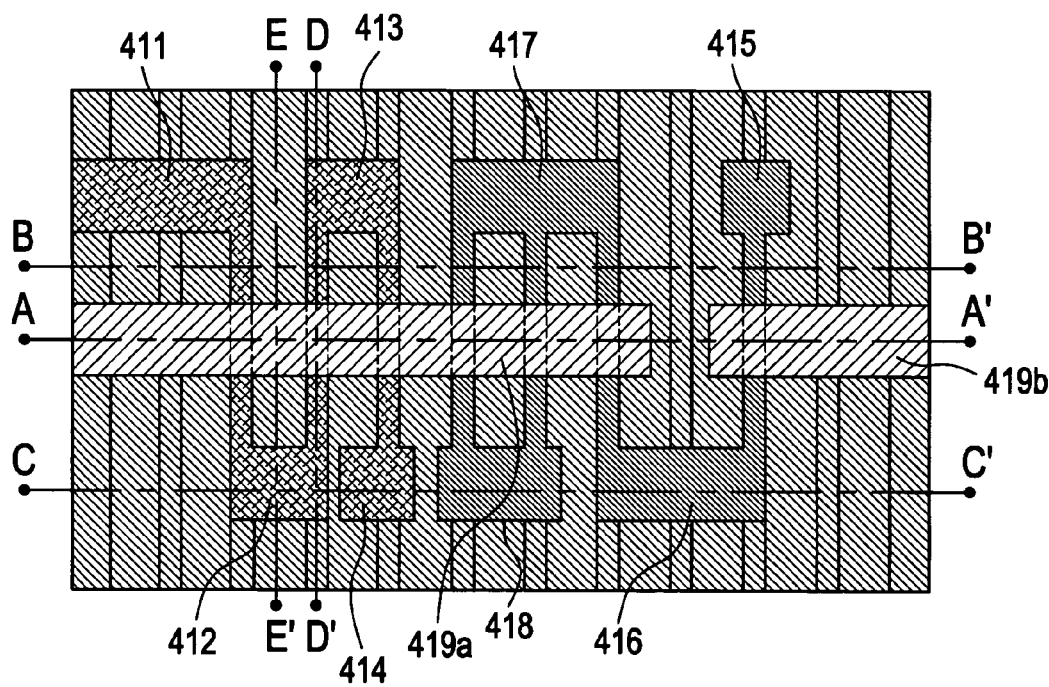
FIGS. 15A to 15F are a top view and longitudinally sectional views explaining the manufacture process of a transistor of this invention.
Figure 15B:
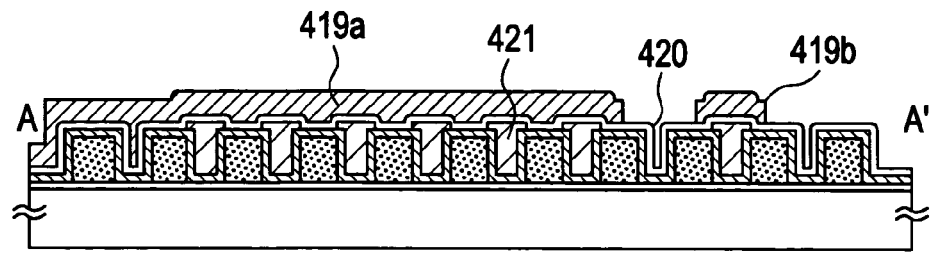
Figure 15C:
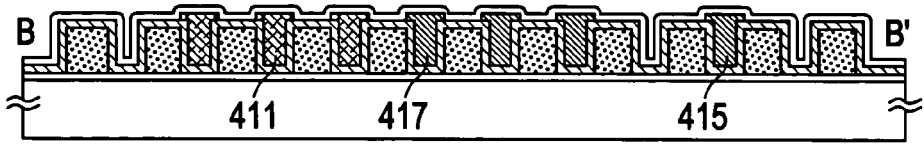
Figure 15D:
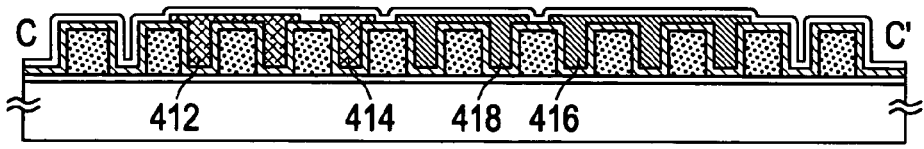
Figure 15E:
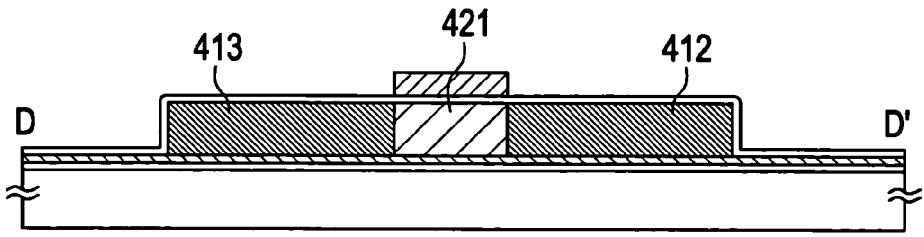
Figure 15F:
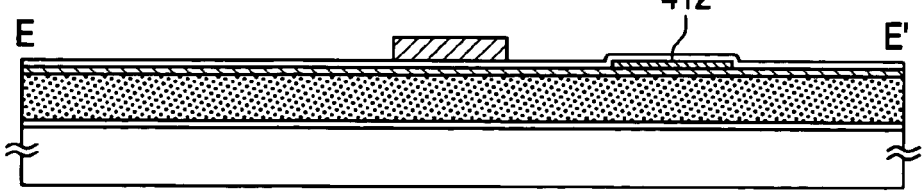

Explanation will be given using FIG. 15. FIG. 15A is a top view, and FIG. 15B to FIG. 15F are cross-sectional views of each applicable part. In addition, it is a view corresponding to the state of FIG. 11 in the embodiment 1. The process which results in this state and a subsequent transistor formation process are shown in the embodiment 1 for reference.

In FIG. 15A, numerals 411 to 418 are impurity fields of a conductive type, numerals 411 and 414 are source regions and drain regions of the p channel type transistor respectively, and numerals 412 and 413 are impurity regions used as wiring. In addition, since occupancy area of the impurity fields 412 and 413 can be enlarged in this invention, this portion may be used only for wire, or may be used as an electrode by extending area. Also, it is possible to process in the crooked form so as to function as a protection circuit.

Moreover, numeral 415 is a source region of the N channel type transistor of a single channel, and numeral 416 is a drain region. Furthermore, such transistor as having the drain region 416 as a source region and impurity region 418 as a drain region is constituted. In this case, impurity region 417 functions as wiring. This transistor is accompanied by three channel formation regions. However two are prepared in parallel inside and connected with the remaining one in series. Of course, this embodiment is not limited to the structure of the transistor described above.

In addition, this embodiment is only an example and proposes a technical thought that the impurity fields of a conductivity type can be used not only as an electrode but also as wiring in this invention. Accordingly, combining with any technology disclosed in the embodiments 1 to 5 makes it possible to obtain the effects described in these embodiments.

Embodiment 7

In a transistor of this invention, it becomes possible to impress the so-called substrate bias by preparing an electric conductive layer in a lower layer side. The manufacture method of a transistor follows the embodiment 3. However, difference will be explained based on the FIG. 16.

In FIG. 16A, on a substrate, a silicon nitride film is formed as first insulating film 802, and tungsten film 803 is formed thereon by sputtering method. When the silicon nitride film is formed by the high frequency sputtering method especially, a finer film can be formed accordingly. Second insulating film 804 is formed by a silicon oxide film. Recesses are formed on the silicon oxide film by etching as shown in the figure. However, since the selection ratio to the tungsten film of a ground material is about 30, easy processing is possible.

On the silicon oxide film 804, a silicon oxynitride film and amorphous silicon film 806 are formed in succession as third insulating film 805. The melt-crystallization of this amorphous semiconductor film 806 is carried out, and as shown in FIG. 16B, crystalline silicon film 807 is formed. Then, as shown in FIG. 16C, channel formation region 808 of a transistor is formed by etching, and gate insulating film 809 and gate electrode 810 are formed. Since the gate insulating film 809 is formed on the tungsten film 803, short circuit with the gate electrode 810 does not occur.

In such a form, if tungsten film 803 is fixed to grounding potential, variation in the threshold voltage of a transistor can be made small. Moreover, ON current can be increased if the gate electrode 810 and this potential are applied and driven.

Moreover, in order to heighten the heat dissipation effect, it is satisfactory to form aluminum oxynitride film (or aluminum nitride film) 811 in the upper layer of the tungsten film 803, as shown in FIG. 17. Object of having these films is to secure the selection ratio of etching processing. That is, in order for the etching gas of fluoride systems, such as $CHF_3$, to remove the silicon oxide serving as the second insulating film 804 and not to expose tungsten film 803 of a ground, aluminum nitride film or aluminum oxynitride film with small selection ratio is preferable as a silicon nitride film.

This embodiment discloses the constitution aiming at threshold control at the time of the heat dissipation effect or actual operation, by preparing an electric conductive film under the second insulating film having projections and recesses formed thereon. And combination with constitution disclosed in the embodiments 1 to 6 is possible. By this combination, the effect described in this embodiment is satisfied.

Embodiment 8

In this embodiment, the embodiment 3 proposes an example where a part of crystalline semiconductor film 307 (the part to serve as a channel formation region later) is subjected to etching to be thin film, before the process to form the active layer 308 of a thin film transistor.

Figure 18A:
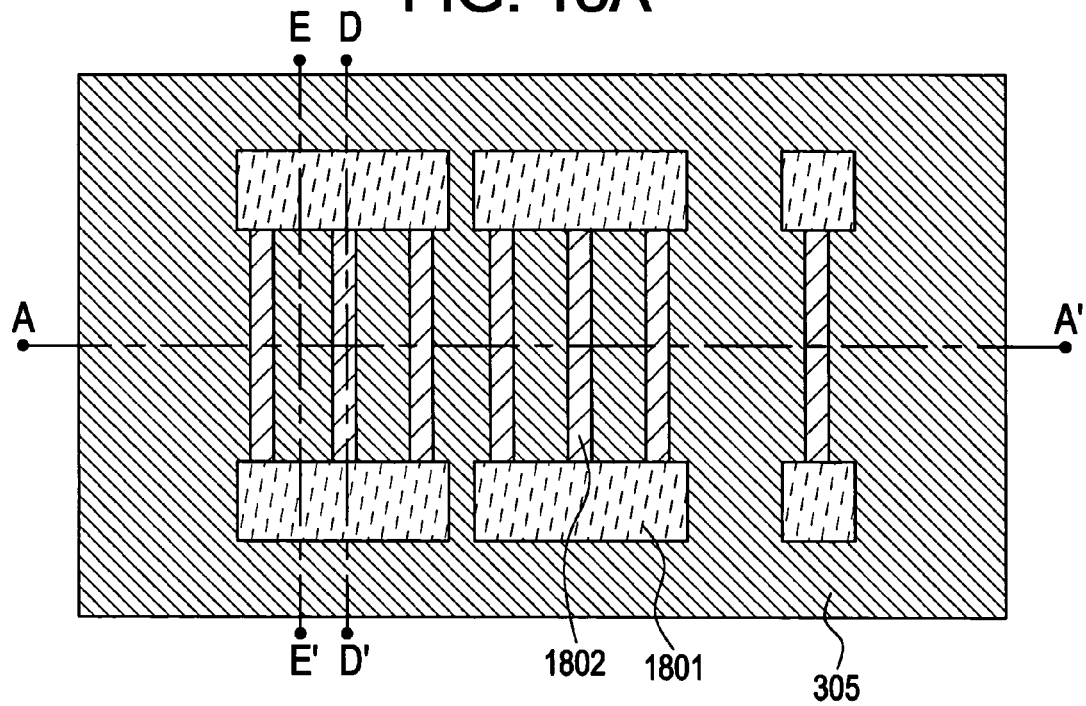
FIGS. 18A to 18D are a top view and longitudinally sectional views explaining the manufacture process of a transistor of this invention.
Figure 18B:
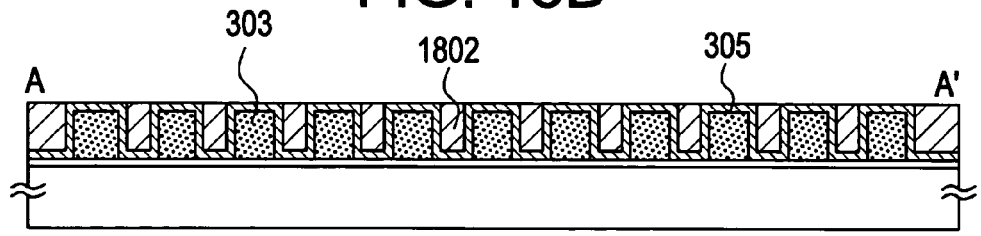
Figure 18C:
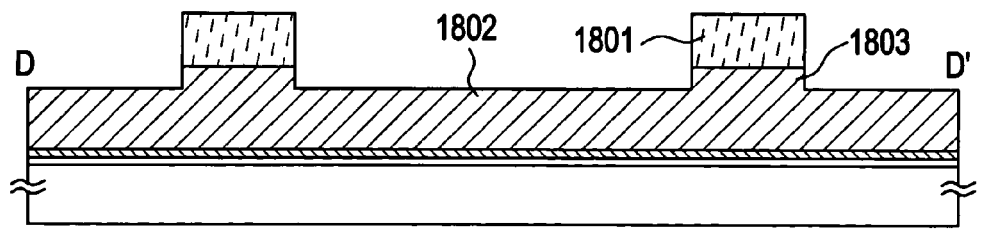
Figure 18D:
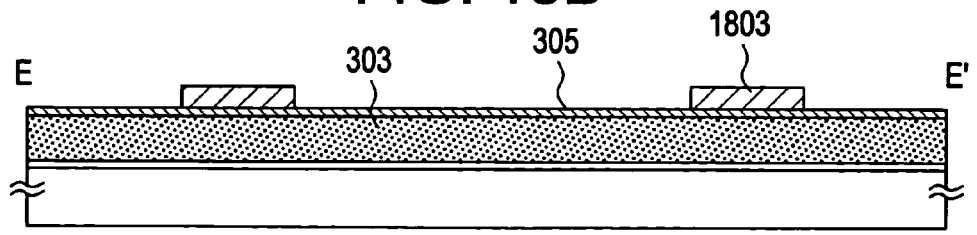

First the state shown in FIG. 8 is obtained according to the manufacturing method shown in the embodiment 3. Next, resist mask 1801 is formed on a semiconductor region of crystalline semiconductor film 307 which will serve as a source region or a drain region later. (FIG. 18A).

And the crystalline semiconductor film 307 is subjected to etching by dry etching method and wet etching method, setting resist mask 1801 as a mask so that the third insulating film 305 may be exposed. The crystalline semiconductor film 1802 can be remained alternatively only in recesses according to this process. Moreover, under the resist mask 1801, crystalline semiconductor film 1803 with original thickness remains. In this embodiment, crystalline semiconductor film 17802 is used as a channel formation region of a thin film transistor and crystalline semiconductor film 1803 is used as a source region or a drain region of a thin film transistor.

In addition, not only the chemical technique but the mechanical grinding method like CMP (chemical mechanical polishing) may be used for the etching process. Also combined use of the chemical technique and the mechanical technique is satisfactory.

According to this embodiment, since a channel formation region can be formed self-aligned by the second insulating film 303, it can be prevented that the channel formation region is formed accidentally on projections of the second insulating film due to a pattern gap. And the situation where crystal grain boundary is contained in the channel formation region can be reduced.

After the above process, the process subsequent to the FIG. 10 of the embodiment 3 may satisfactorily be referred to, omitting and simplifying the explanation in this embodiment. In addition, this embodiment can be freely combined with any embodiments. 1 to 7.

Embodiment 9

This invention can be applied to various semiconductor devices, and the form of the display panel produced based on the embodiments 1 to 8, will be explained. In addition, as an example of the display panel shown in this embodiment, the display panel using a transistor as semiconductor elements, such as a liquid-crystal-display panel, EL (Electro Luminescence) display panel, and a display panel for FED (Field Emission Display), are mentioned. Of course, these display panels include a module which is currently circulated in a market.

Figure 19:
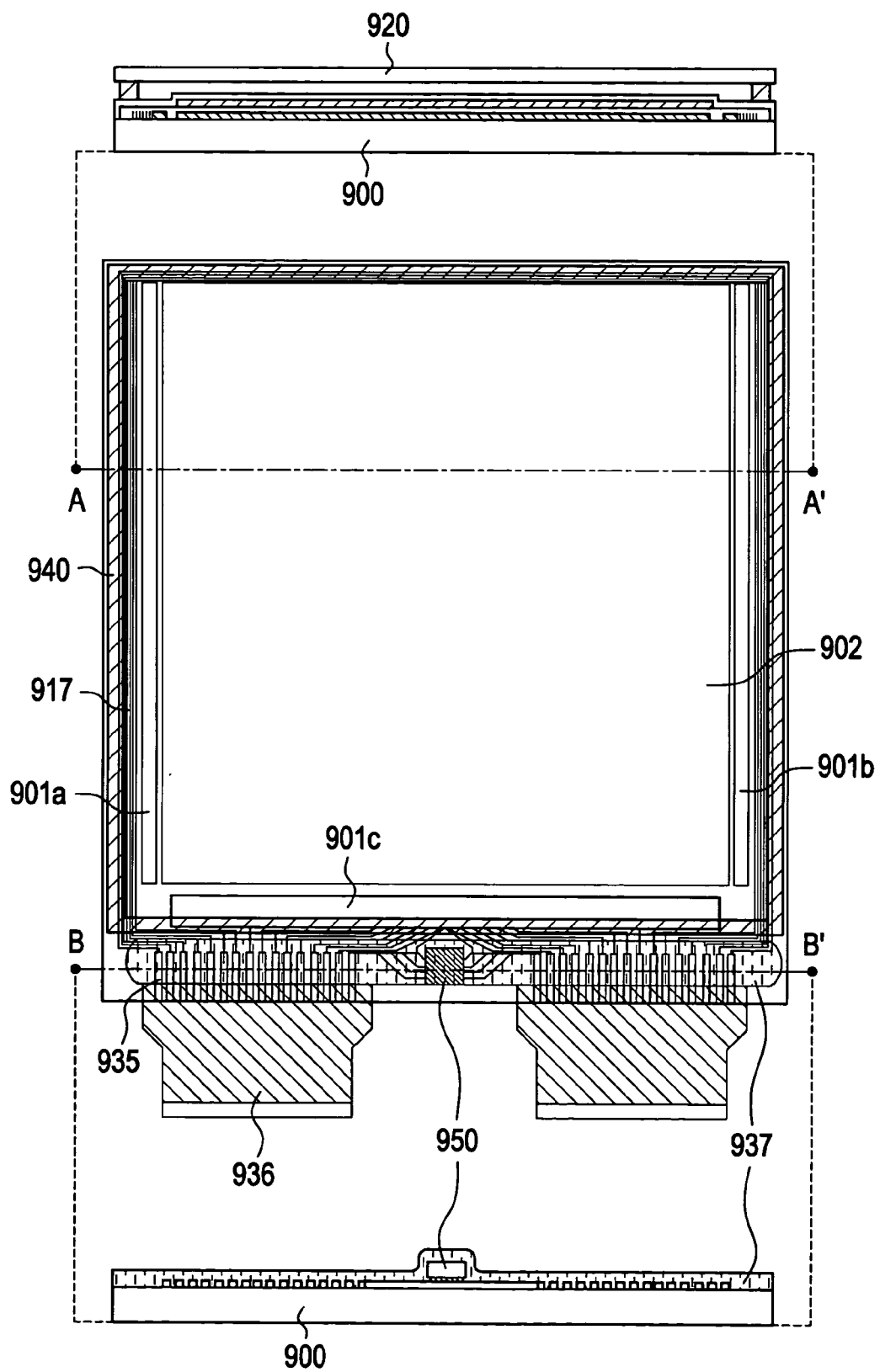
FIG. 19 is an external view showing an example of a semiconductor device of this invention.

Substrate 900 of FIG. 19 has pixel part 902, gate signal side drive circuit 901a, 901b, data signal side drive circuit 901c, input-and-output terminal part 908, and wiring, or wiring group 917 formed thereon.

Seal pattern 940 is a pattern for making sealing space between opposite substrate 920 and substrate 900, and in case of a liquid-crystal-display panel, liquid crystal is enclosed, and in case of an EL panel, EL material (especially organic electro luminescence material) is protected from open air. The part may overlap with the wiring or wiring group 917 which connects gate signal side drive circuit 901a, 901b, data signal side drive circuit 901c and the drive circuit part, and an input terminal. With this arrangement, the area of the frame region (circumference region of a pixel part) of the display panel can be reduced. In an external input terminal part, FPC (flexible print circuit) 936 is fixated.

Furthermore, chip 950 having various logic circuits, a high frequency circuit, a memory, a microprocessor, a media processor/DSP (Digital Signal Processor), LSI for graphics, Code LSI, and amplifier formed therein may be mounted using a transistor obtained in this invention. These functional circuits are formed with a different design rule from pixel part 902, gate signal side drive circuit 901a, 901b, and data signal side drive circuit 901c, and specifically, a design rule of 1 µm or less is applied. Incidentally, it is satisfied that the external input terminal part and chip 950 are protected with resin (such as mall resin) 937. Moreover, there is no limitation in the method of mounting, and such a system using a TAB tape and a COG (chip-on glass) system can be applied.

In addition, in this embodiment, FIG. 13A and FIG. 13B are suitable as gate structure of a transistor. For example, the transistor shown in the embodiments 3 to 4 is applicable as switching elements of pixel part 902, and applicable as an active elements constituting gate signal side drive circuit 901a, 901b, and data signal side drive circuit 901c further. Of course, this embodiment represents an example of a display panel obtained by this invention and is not limited to the constitution of FIG. 19.

Embodiment 10

Various electronic apparatus can be completed using this invention. As for the example, handheld terminals (electronic notebooks, mobile computers, cellular phones, and the like), video cameras, digital cameras, personal computers, TV sets, cellular phones, and the like are mentioned. Those examples are shown in FIG. 20. In addition, the electronic apparatus shown here is only an example, and is not limited to the above uses.

Figure 20A:
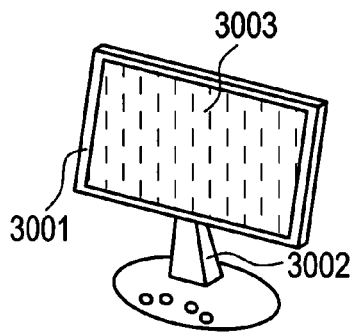
FIGS. 20A to 20G are views showing an example of an electronic device of this invention.

FIG. 20A is an example where a TV set is completed with the application of this invention, which is constituted by case 3001, support stand 3002, and display part 3003. Various integrated circuits other than the display part 3003, such as various logic circuits, a high frequency circuit, a memory, a microprocessor, a media processor, and LSI for graphics, can be formed and incorporated on glass to thereby constitute a TV set according to this invention.

Figure 20B:
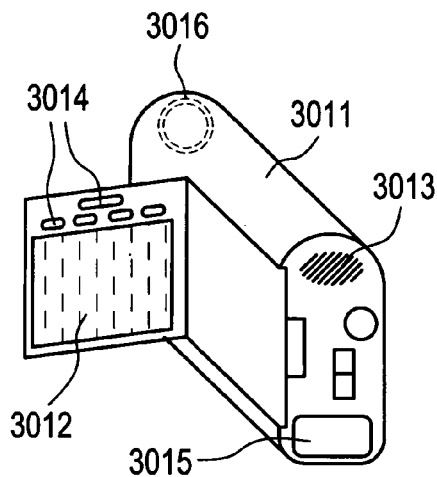

FIG. 20B is an example where a video camera is completed with the application of this invention, which is constituted by main part 3011, display part 3012, voice input part 3013, operation switch 3014, battery 3015, and television part 3016. Various integrated circuits other than the display part 3012, such as various logic circuits, a high frequency circuit, a memory, a microprocessor, a media processor, and LSI for graphics, can be formed and incorporated on glass to thereby constitute a video camera according to this invention.

Figure 20C:
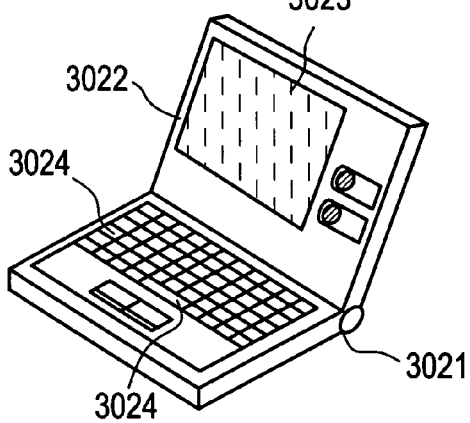

FIG. 20C is an example where a personal computer of a note type is completed with the application of this invention, which is constituted by main part 3021, case 3022, display part 3023, and keyboard 3024. Various integrated circuits other than the display part 3023, such as various logic circuits, a high frequency circuit, a memory, a microprocessor, a media processor, LSI for graphics and code LSI, can be formed and incorporated on glass to thereby constitute a personal computer according to this invention.

Figure 20D:
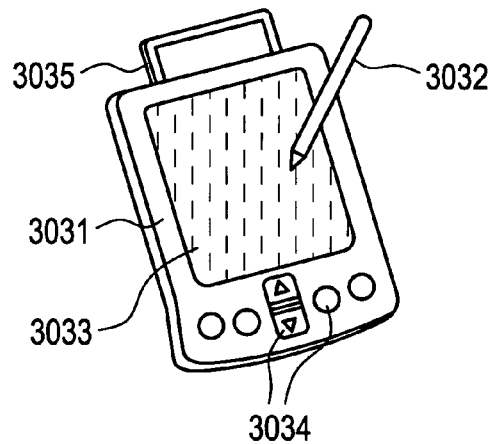

FIG. 20D is an example where PDA is completed (Personal Digital Assistant) with the application of this invention, which is constituted by main part 3031, stylus 3032, display part 3033, operation button 3034, and external interface 3035. Various integrated circuits other than the display part 3033, various logic circuits, a high frequency circuit, a memory, a microprocessor, a media processor, LSI for graphics, and code LSI can be formed and incorporated on glass to thereby constitute a PDA according to this invention.

Figure 20E:
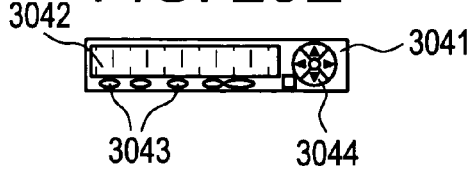

FIG. 20E is an example where a sound playback apparatus such as on-board audio device specifically is completed with the application of this invention, which is constituted by main part 3041, display part 3042, operation switch 3043 and 3044. Various integrated circuits other than the display part 3042, such as various logic circuits, a high frequency circuit, a memory, a microprocessor, a media processor, LSI for graphics, and an amplification circuit can be formed and incorporated on glass to thereby constitute an audio apparatus according to this invention.

Figure 20F:
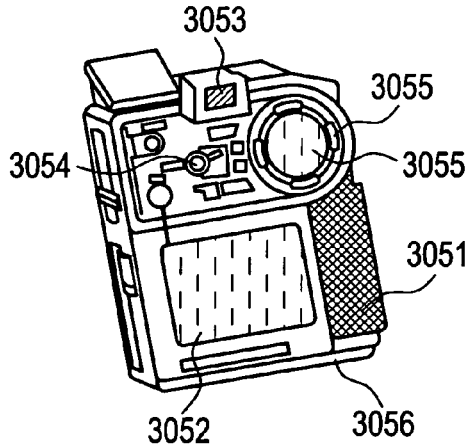

FIG. 20F is an example where a digital camera is completed with the application of this invention, which is constituted by main part 3051, display part A 3052, eyepiece part 3053, operation switch 3054, display part B 3055, and battery 3056. Various integrated circuits other than the display part A 3052 and display part B 3055 such as various logic circuits, a high frequency circuit, a memory, a microprocessor, a media processor, LSI for graphics, and code LSI can be formed and incorporated on glass to thereby constitute a digital camera according to this invention.

Figure 20G:
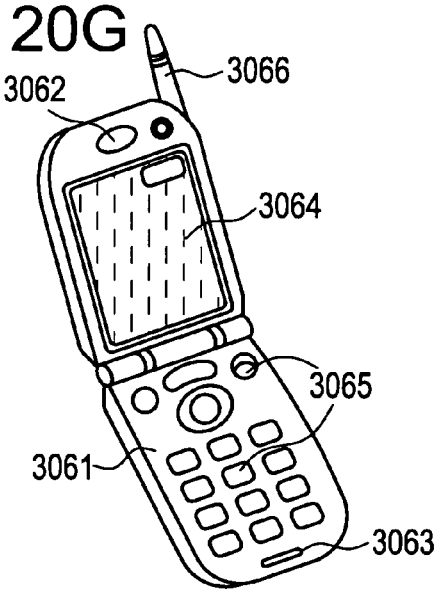

FIG. 20G is an example where a cellular phone is completed, and constituted by main part 3061, voice output part 3062, voice input part 3063, display part 3064, operation switch 3065, and antenna 3066. Various integrated circuits other than the display part 3064 such as various logic circuits, a high frequency circuit, a memory, a microprocessor, a media processor, LSI for graphics, and code LSI, and LSI for cellular phone can be formed and incorporated on glass to thereby constitute a cellular phone according to this invention.

Embodiment 11

The constitution of a laser irradiation device used in this embodiment will be explained in conjunction with FIG. 21. Numeral 11 is a laser oscillation device. In addition, although two sets of laser oscillation devices are used in FIG. 21, the laser oscillation device may not be limited to this number, but three sets or four sets, or more may be used.

Also, the temperature of laser oscillation device 11 may be kept constant using chiller 12. The chiller 12 is not necessarily formed, but keeping the temperature of laser oscillation device 11 constant makes it possible to control the fluctuation of the outputted energy of laser beams according to the temperature.

Also, numeral 14 is an optical system, and can change light path outputted from laser oscillation device 11, or can condense laser beams by processing the form of the laser beams. Furthermore, the laser beams outputted by the optical system 14 from pluralities of laser oscillation devices 11 is synthesized by partially overlapping mutually in the laser irradiation device of FIG. 21.

In addition, AO modulator 13 which can primarily intercept laser beams completely may be formed in light path between processing substrate 16 and laser oscillation device 1. Moreover, instead of AO modulator, attenuator (light intensity correction filter) may be formed to adjust the energy density of laser beams.

Moreover, measuring means 20 (energy density measurement means) to measure the energy density of laser beams outputted to the light path from laser oscillation device 11 may be formed in light path between the processing substrate 16 and the laser oscillation device 11, so that the time-lapse change of energy density may be supervised by computer 10. In this case, output from the laser oscillation device 10 may be heightened so that attenuation of the energy density of the laser beams may be compensated.

The synthesized laser beams are irradiated onto substrate 16, which is a processing object, through slit 15. Slit 15 is capable of interrupting the laser beams and preferably formed of the material resistant to transformation or damage by the laser beams. And the width of the slit of the slit 15 is variable and the width of the laser beams can be changed by the width of the slit accordingly.

In addition, the form of the laser beams in substrate 16 which is oscillated from laser oscillation device 11 in case of not passing through slit 15 is different according to the kind of laser, or can be formed by optical system.

Substrate 16 is laid on stage 17. In FIG. 21, position control means 18 and 19 are equivalent to control means to control the position of laser beams in a processing object, and the position of stage 17 is controlled by the position control means 18 and 19. In FIG. 21, the position control means 18 performs position control of the position of the stage 17 in the X direction, and the position control means 19 performs position control of the stage 17 in the Y direction.

Also, a laser irradiation device of FIG. 21 includes computer 10 having memory means such as a memory and central processing units. The computer 10 controls the oscillation of laser oscillation device 151, defines the scanning course of laser beams, and the position control means 18 and 19 are controlled so that the laser beams may be scanned according to the predetermined scanning course, to thereby move the substrate to the predetermined position.

In addition, the position of a laser beam is controlled by moving a substrate in FIG. 21, but the movement may be carried out using optical systems, such as galvano-mirror, or the both of them may be used.

Furthermore, in FIG. 21, the width of slit 15 can be controlled by computer 10, and the width of a laser beam can be changed according to the pattern information on a mask. In addition, the slit is not necessarily formed.

Furthermore, laser irradiation device may be equipped with correction means to adjust the temperature of a processing object. Also, since laser beams has directivity and high energy density, a damper may be formed to prevent Catoptric light from irradiating onto an unsuitable part. Damper is preferably to be absorbent for catoptric light. In addition, cooling water may be circulated in a damper beforehand to prevent the temperature of a buffer layer from rising by absorption of catoptric light. Moreover, heating means (substrate heating means) for heating a substrate may be formed in stage 157.

In addition, when forming a marker by laser, a laser oscillation device for markers may be formed. In this case, oscillation of the laser oscillation device for markers may be controlled by computer 10. Furthermore, when forming the laser oscillation device for markers, the optical system for condensing the laser beams outputted from the laser oscillation device for markers is formed separately. In addition, as for the laser used when the marker is formed, such as YAG laser and $CO_2$ laser are mentioned typically. However, the other lasers can also be used for making a marker, of course.

Moreover, for alignment by use of a marker, one set of CCD camera 21, or several CCD cameras depending on the circumstances, may be provided. Incidentally, a CCD camera means the camera using CCD (charge coupled device) as an image sensor. Moreover, without establishing a marker, pattern of an insulating film or a semiconductor film is recognized by CCD camera 21 and alignment of the substrate may be performed. In this case, pattern information on an insulating film by the mask inputted into the computer 10 and a semiconductor film and the pattern information on the actual insulating film collected in CCD camera 21 or a semiconductor film can be tested by comparison, and the position information on a substrate can be grasped. In this case, the marker is not necessarily established separately.

Moreover, laser beams carrying out incidence to substrates turn into the so-called return beams returning the same light path as the time of reflecting and carrying out incidence on the surface of this board. However, this return light has adverse influences, such as an output of laser, change of frequency, and destruction of a rod. Therefore, in order to remove the return light and to stabilize the oscillation of laser, an isolator may be installed.

In addition, the constitution of a laser irradiation device having pluralities of laser oscillation device formed therein is shown in FIG. 21. The constitution described above has merit that the designing of an optical system becomes easy. When an amorphous semiconductor film is melted, it is preferable to use linear laser beams especially from a viewpoint of the improvement in a throughput. However, if the longitudinal direction (X-axis direction in FIG. 3) becomes long, the optical design becomes very precise. Therefore, the burden of an optical design can be mitigated by using pluralities of linear laser beams in an overlapped manner.

Figure 22A:
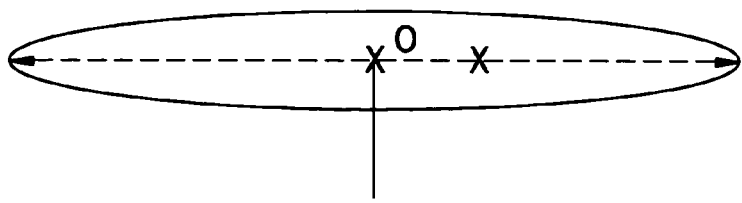
FIGS. 22A to 22D are views showing the constitution of a laser beam used for operation of this invention.

For example, one linear laser beam can be formed by optically compounding pluralities of laser beams oscillated from pluralities of laser oscillation devices. FIG. 22A is a view showing the irradiation section of each laser beam. The case where the irradiation region of laser beams serves as ellipse form is mentioned as the example here. However, there is no form difference.

The form of laser beams is varied according to the kinds of laser, and can be formed by the optical system also. For example, the form of the laser beams ejected from the XeCl excimer laser L3308, product of Ramda Co. LTD. (wavelength of 308 nm and pulse width of 30 ns) presents the short form of 10 nm×30 nm (half-the-price width in both beam profiles). Also, the form of the laser beam ejected from YAG laser becomes circular if rod is formed in cylinder, and if it is a slab type, it presents short form. The laser beam of a desired size can also be formed by fabricating such a laser beam further by the optical system.

Figure 22B:
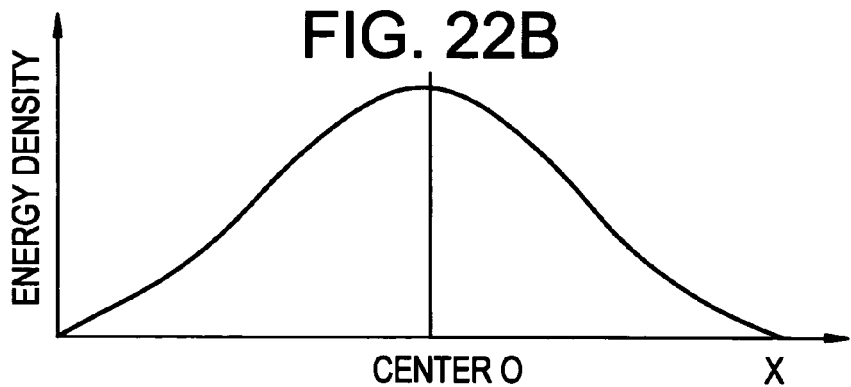

The distribution of the energy density of the laser beam in the longitudinal direction of laser beams (X-axis direction) shown in FIG. 22A is shown in FIG. 22B. The laser beam shown in FIG. 21A is equivalent to the region where $1/e^2$ of energy density of peak value in FIG. 22B is satisfied. The distribution of the energy density of the ellipse-shaped laser beam is increased as becoming closer to the center O of the ellipse. Thus, energy density of the laser beams shown in FIG. 22A in the direction of a main axis is compliant with Gaussian distribution, and the region as judged to be uniform in energy density becomes narrow.

Figure 22C:
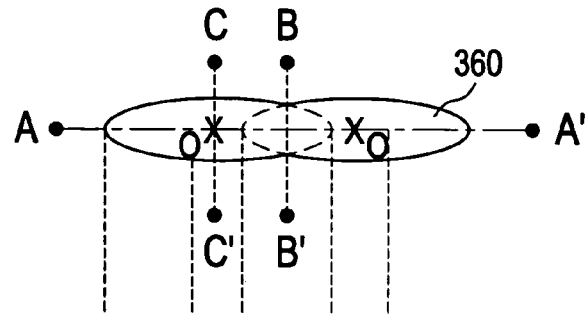

Next, an irradiation section form of the linear laser beam made up of two laser beams shown in FIG. 22A, which are synthesized, is shown in FIG. 22C. In addition, FIG. 22C shows the case where one linear laser beam is formed by piling up two laser beams. The number of the laser beam to be overlapped is not limited thereto.

As shown in FIG. 22C, each laser beam is in agreement in the long axis of each ellipse, and synthesized by partially overlapped laser beams to produce one linear laser beam 30. In addition, hereafter, the straight line obtained by connecting the center O of each ellipse is set as the main axis of the laser beam 30.

Figure 22D:
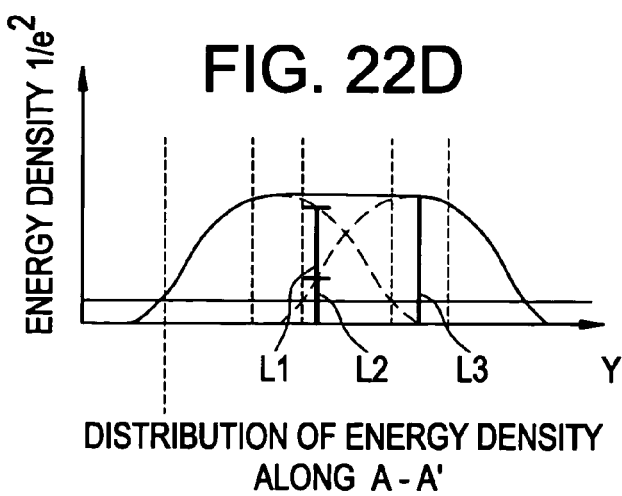

The distribution of the energy density in the main axis y direction of the linear laser beam after synthesis shown in FIG. 22C is shown in FIG. 22D. In addition, the laser beam shown in FIG. 22C is equivalent to the region where $1/e^2$ of energy density of peak value in FIG. 22B is satisfied. Energy density is added in the portion where each laser beam before synthesis is overlapped. For example, if the energy densities L1 and L2 of the energy light of the overlapped laser beams are added as shown in the figure, it becomes almost equal to the peak value L3 of the energy density of each laser beam, and flattening of the energy density is occurred between the centers O of each ellipse.

In addition, it is ideal to become equal to L3 if L1 and L2 are added. However realistically, it does not necessarily become an equal value. The tolerance level of a gap of the value adding L1 and L2 and the value L3 can be suitably set up by the designer.

If laser light is used independently, since energy density is compliant with Gaussian distribution, it is difficult to irradiate the laser of uniform energy density onto the whole semiconductor film which is in contact with the flat portion of an insulating film. However, as shown in FIG. 22D, by overlapping pluralities of laser beams and compensating a part where energy density is lower, the region with uniform energy density is expanded so as to raise the crystallizability of a semiconductor film efficiently compared with the case where pluralities of laser beams are not used in an overlapping manner, but used independently.

In addition, as for the distribution of energy density, B-B' is a little smaller than C-C'. However, B-B' and C-C' can be considered to be almost the same sizes. And the form of the laser beam synthesized in the region with energy density of the $1/e^2$ of the peak value of the laser beam before synthesis can be said as linear.

In addition, the region where energy density is low exists in the neighborhood of outer edge of the irradiation region of the synthesized linear laser beam 30. Since crystallizability may be spoiled on the contrary if this region is used, it can be a more preferable form not to use the outer edge of the linear laser beam, but use slit 15 as shown in FIG. 21.

In carrying out laser beam irradiation of this invention, the laser irradiation device explained in this embodiment can be used. It can be adapted for either of the embodiments 1 to 10. Moreover, even if linear laser beams have advantages, there arises a problem of pushing up the cost of the optical system or laser oscillation apparatus. If desired linear laser beam can be obtained in one set of laser oscillation apparatus and optical system, it is satisfactory to practically use such laser irradiation device.

Embodiment 12

This embodiment shows an example that second insulating film 303 is formed using glass substrate 301 as an etching stopper in the embodiment 3, and the insulating film (serving as third insulating film 305 also) equivalent to first insulating film 302 is formed on the second insulating film 303.

Figure 29A:
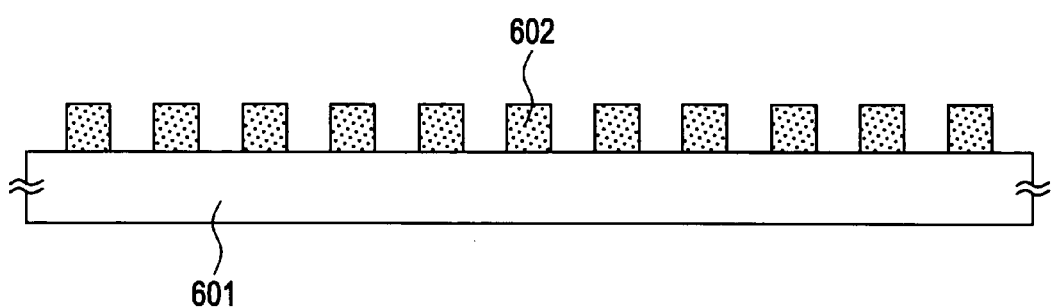
FIGS. 29A and 29B are longitudinally sectional views explaining the manufacture process of a transistor of this invention.

In FIG. 29A, second insulating film 602 with recesses formed on glass substrate 601 in the predetermined shape with silicon oxide or silicon oxynitride is formed. Details are the same as embodiment 3. Wet etching or dry etching is sufficient as formation of the recesses. However, dry etching using $CHF_3$ gas is used in this embodiment. In this case, gas flux may be set to 30 to 40 sccm and reaction pressure may be set to 2.7 to 4.0 KPa, impression electric power may be set to 500 W and substrate temperature may be set to 20° C.

Also, in case of this embodiment, it is preferable to use the material as glass substrate 601, with high selection ratio with silicon oxide (for example, 1737 glass substrates from Corning, Inc.). If a selection ratio is high, glass substrate 601 can be used as an etching stopper as it is in the formation of second insulating film 602.

Figure 29B:
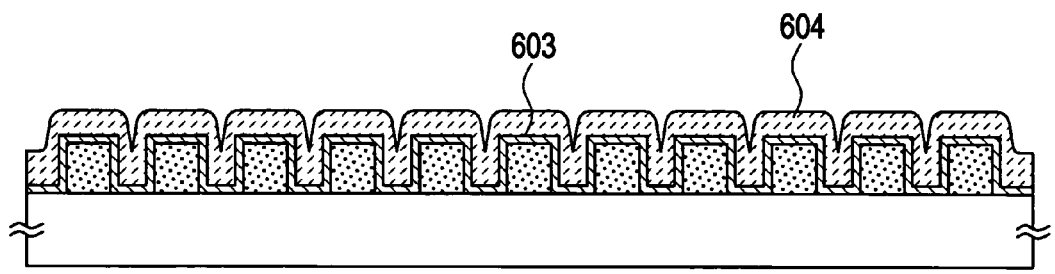

Then second insulating film 602 which is formed beforehand is covered with silicon nitride, silicon oxynitride with a bigger nitrogen content than an oxygen content, or first insulating film 603 consisting of these laminates. Furthermore, amorphous semiconductor film 604 is formed thereon, to obtain the state shown in FIG. 29B. Details of these first insulating film 603 and amorphous semiconductor film 604 are described in the embodiment 3 for reference. Moreover, the process subsequent to FIG. 29B is processed in accordance with the embodiment 3, omitting and simplifying the explanation here.

According to this embodiment, sufficiently high selection ratio of glass substrate 601 and second insulating film 602 can be secured. Therefore, when recesses of the second insulating film 602 are formed, process margin improves, involving no problems such that lower end portion of the second insulating film 602 is scooped out. Furthermore, the portion with no insulating film 602 formed thereon consists of a silicon nitride film, silicon oxynitride film with a bigger nitrogen content than an oxygen content, or these laminated films on a glass substrate. Therefore, it is not necessary to use special insulating films such as aluminum nitride.

In addition, this embodiment can be combined with either of the embodiments 1 to 11 freely.

EXAMPLE 1

A crystalline semiconductor film obtained in this invention is shown in this example. In addition, since the crystallization process was performed according to the embodiments 2 and 3, this embodiment is explained with reference to FIG. 6 to FIG. 8.

In this embodiment, a silicon oxynitride film with thickness of 50 nm was used as first insulating film 302 in FIG. 6, and a silicon nitride film with thickness of 200 nm was used as second insulating film 303. In this case, since the first insulating film 302 of a ground was subjected to etching when the second insulating film 303 was also subjected to etching, resulting in obtaining the height of 250 nm equivalent to the level difference d in FIG. 1. Moreover, width of the second insulating film 303 (it is equivalent to W1 in FIG. 1) was set to 0.5 μm, and distance between contiguity (it is equivalent to W2 in FIG. 1) was set to 0.5 μm.

Moreover, after a silicon oxynitride film with thickness of 20 nm is formed as the third insulating film 305 on the second insulating film 303, an amorphous silicon film with thickness of 150 nm was continuously formed as amorphous semiconductor film 306, without carrying out air release. Moreover, the amorphous silicon film was crystallized using the crystallization technology of the embodiment 2. Specifically, with 10 ppm acetic acid nickel solution held on the amorphous silicon film, 550° C. heat treatment for 4 hours is conducted to obtain crystallization, before linear laser beams are irradiated. YVO$_4$ laser oscillation apparatus of continuous oscillation mode is used for the linear laser beams, and output 5.5 W of the second harmonics (wavelength of 532 nm) is condensed in an optical system, to be scanned at a rate of room temperature 50 cm/sec.

Figure 26A:
FIGS. 26A and 26B are a TEM photograph and its schematic diagram observing the upper surface of the crystalline silicon film obtained by this invention.
Figure 26B:
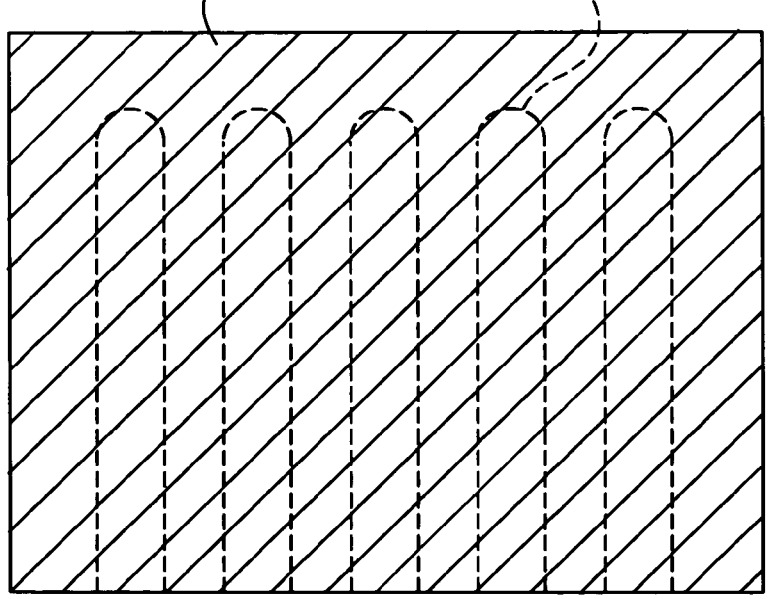

FIG. 26A is a TEM (transmission type electron microscope) photograph in the state (state shown in FIG. 8) where the crystalline silicon film 307 is formed, and FIG. 26B is a schematic diagram of the same. Laminates of first insulating film 302 and second insulating film 303 exists in the state where it is buried completely under crystalline silicon film 307.

Figure 27A:
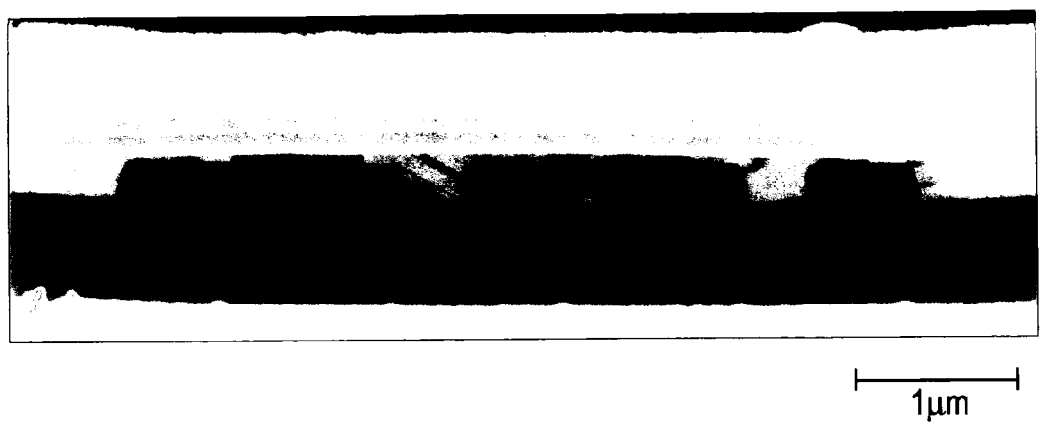
FIGS. 27A and 27B are a TEM photograph and its schematic diagram observing the section of the crystalline silicon film.
Figure 27B:
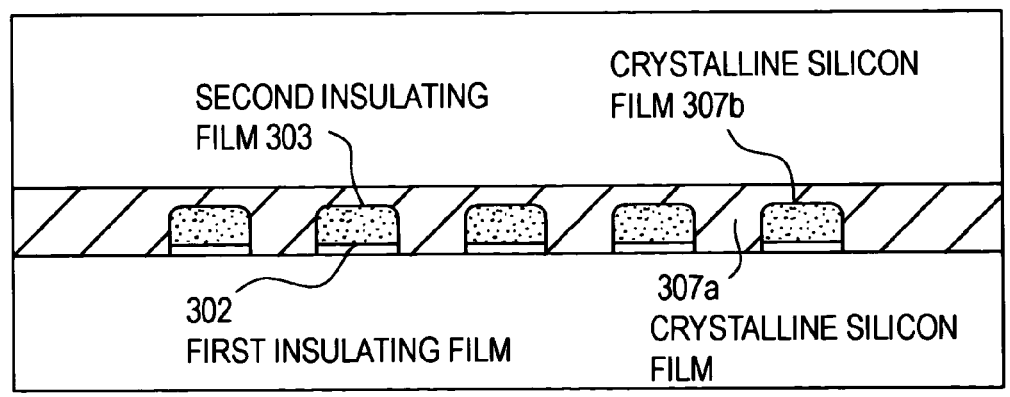

FIG. 27A is a cross-sectional TEM photograph observing the section of FIG. 26A, and FIG. 27B is a schematic diagram of the same. On the second insulating film 303 (recesses) formed in stripe pattern, crystalline silicon film 307*a* is formed so that it may be filled up. And crystalline silicon film 307*b* is formed on the upper surface part (projections) of the second insulating film 303.

Figure 28A:
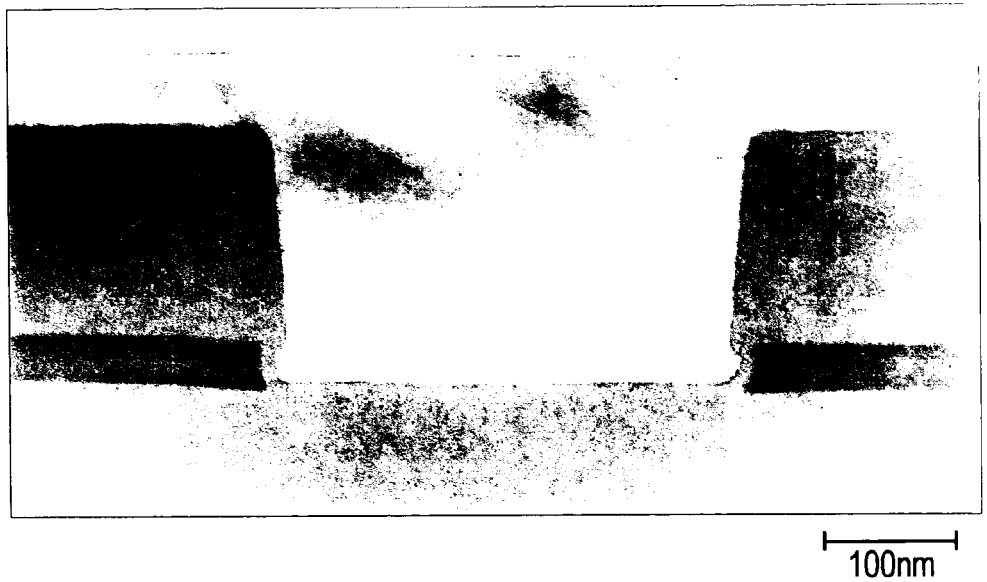
FIGS. 28A and 28B are a TEM photograph and its schematic diagram observing the section of the crystalline silicon film.
Figure 28B:
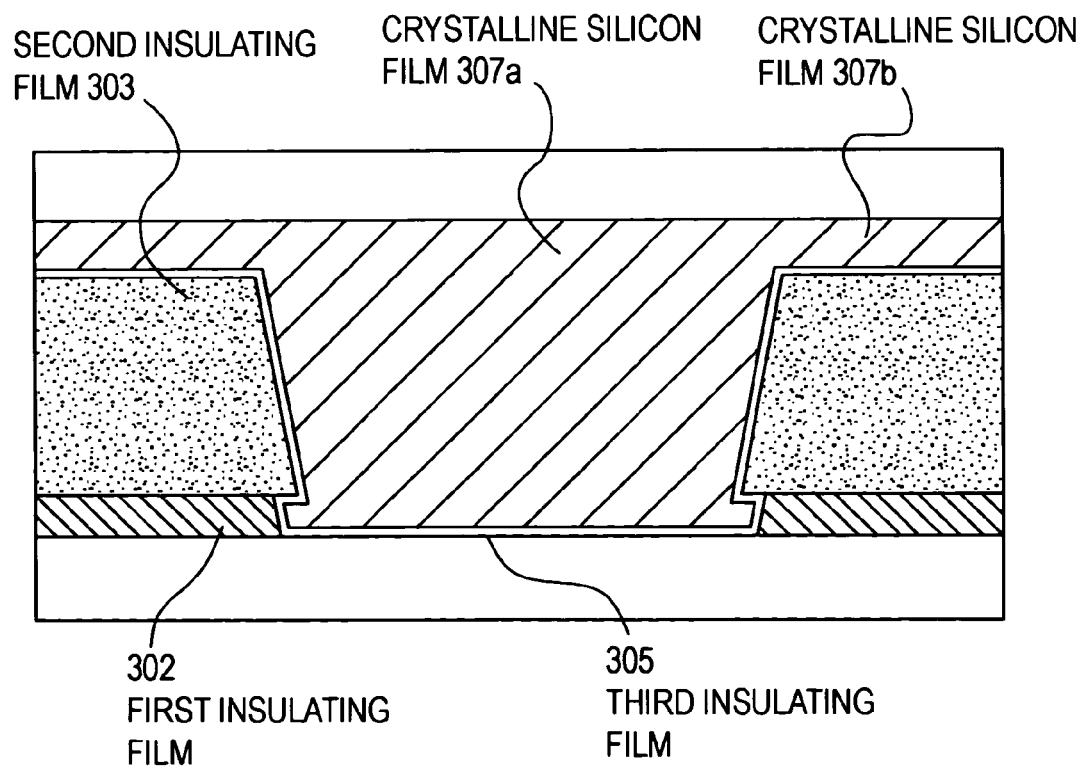

FIG. 28A is a cross-sectional TEM photograph performing colonoscopic observation of the section of FIG. 27A, and FIG. 28B is a schematic diagram of the same. Third insulating film 305 is observed by this photograph. Neither crystal boundary nor defects-like things can be observed inside crystalline silicon film 307*a*. This shows a very high crystallizability.

This invention provides a semiconductor device wherein crystalline silicon film 307*a* with a good crystallizability is used as a channel formation region, and by using crystalline silicon film 307*b* with inferior crystallizability positively as an electrode or wiring, high-speed operation is possible, and a thin film transistor with little variations in pluralities of elements or this thin film transistor group can be accumulated at high degree of accumulation.

As explained above, linear stripe pattern having irregular form is formed by insulating films, an amorphous semiconductor is deposited thereon, and crystallization is occurred subsequent to melting state by laser beams so that a semiconductor may be poured in recesses and solidified. And deviation or stress accompanying crystallization can be centralized on regions other than recesses. This makes it possible to selectively form bad crystalline regions, such as crystal grain boundary.

Then, a crystalline semiconductor film with no crystal grain boundary thereon can be completed by specifying the place of a channel formation region especially. Causative factor of variation in characteristics due to crystal grain boundary or crystal defects which improperly intervenes can be thus eliminated, to allow a transistor or transistor element group with little variation in characteristics to be formed.

As described above, this invention provides a semiconductor device wherein a crystalline semiconductor film with good crystallizability is used as a channel formation region, and a semiconductor film with inferior crystallizability is positively used as an electrode or wiring. It can thereby achieve a high-speed operation and high current drive capability, and provide a semiconductor device consisting of semiconductor elements with little variations in pluralities of elements or that semiconductor element group accumulated at high rate.

What is claimed is:

1. A semiconductor element comprising:
   a projection and a recess provided over an insulating surface, the projection provided in a linear-shaped stripe pattern and comprising an insulating material;
   a first crystalline semiconductor region having a plurality of crystal orientations in the recess;
   a second crystalline semiconductor region which is conductive and is provided over the projection and the recess, the first crystalline semiconductor region connected to the second crystalline semiconductor region,
   a channel region provided in the first crystalline semiconductor region; and
   a gate electrode provided adjacent to the channel region with a gate insulating film therebetween, the gate electrode overlapping with the projection and the recess,
   wherein the first crystalline semiconductor region extends in a direction parallel to the linear-shaped stripe pattern, and
   wherein a portion of the gate insulating film is provided in contact with the projection.

2. A semiconductor element according to claim 1, wherein the surface of the insulating surface is a surface of an insulating film provided over a glass substrate.

3. A semiconductor element according to claim 1, wherein width of the insulating film which extends in linear stripe pattern is 0.1 to 10 μm, the adjoining pattern interval is 0.01 to 2 μm, and film thickness is 0.01 to 3 μm.

4. A semiconductor element according to claim 1 wherein the semiconductor element is incorporated into one selected from the group consisting of a TV set, a video camera, a personal computer, a personal digital assistant, a sound playback apparatus, a digital camera, and a cellular phone.

5. A semiconductor element according to claim 1, wherein the other portion of the channel region is provided over the recess.

6. A semiconductor element according to claim 1, wherein the projection has a rectangular pattern.

7. A semiconductor element comprising:
   a projection and a recess provided over an insulating surface, the projection provided in a linear-shaped stripe pattern and comprising an insulating material;

a first crystalline semiconductor region including a plurality of crystal orientations in the recess;
a second crystalline semiconductor region which is conductive and is provided over the projection and the recess, the first crystalline semiconductor region connected to the second crystalline semiconductor region;
a channel region provided in the first crystalline semiconductor region; and
a gate electrode provided adjacent to the channel region with a gate insulating film therebetween, the gate electrode overlapping with the projection and the recess,
wherein the first crystalline semiconductor region extends in a direction parallel to the linear-shaped stripe pattern,
wherein the second crystalline semiconductor region is provided over the projection,
wherein the second crystalline semiconductor region includes a portion thinner than the first crystalline semiconductor region, and
wherein a portion of the gate insulating film is provided in contact with the projection.

8. A semiconductor element according to claim 7, wherein the surface of the insulating surface is a surface of an insulating film provided over a glass substrate.

9. A semiconductor element according to claim 7, wherein width of the insulating film which extends in linear stripe pattern is 0.1 to 10 μm, the adjoining pattern interval is 0.01 to 2 μm, and film thickness is 0.01 to 3 μm.

10. The semiconductor element according to claim 7 wherein the semiconductor element is incorporated into one selected from the group consisting of a TV set, a video camera, a personal computer, a personal digital assistant, a sound playback apparatus, a digital camera, and a cellular phone.

11. A semiconductor element according to claim 7, wherein the other portion of the channel region is provided over the recess.

12. A semiconductor element according to claim 7, wherein the projection has a rectangular pattern.

13. A semiconductor element comprising:
a projection and a recess provided over an insulating surface, the projection provided in a linear-shaped stripe pattern and comprising an insulating material;
a first crystalline semiconductor region including a plurality of crystal orientations in the recess;
a second crystalline semiconductor region which is conductive and is provided over the projection and the recess, the first crystalline semiconductor region connected to the second crystalline semiconductor region,
a channel region provided in the first crystalline semiconductor region; and
a gate electrode provided adjacent to the channel region with a gate insulating film therebetween, the gate electrode overlapping with the projection and the recess,
wherein the first crystalline semiconductor region extends in a direction parallel to the linear-shaped stripe pattern,
wherein the second crystalline semiconductor region is used as a wiring,
wherein the second crystalline semiconductor region includes a portion with a thinner film than that of the first crystalline semiconductor region, and
wherein a portion of the gate insulating film is provided in contact with the projection.

14. A semiconductor element according to claim 13, wherein the surface of the insulating surface is a surface of an insulating film provided over a glass substrate.

15. A semiconductor element according to claim 13, wherein width of the insulating film which extends in linear stripe pattern is 0.1 to 10 μm, the adjoining pattern interval is 0.01 to 2 μm, and film thickness is 0.01 to 3 μm.

16. The semiconductor element according to claim 13 wherein the semiconductor element is incorporated into one selected from the group consisting of a TV set, a video camera, a personal computer, a personal digital assistant, a sound playback apparatus, a digital camera, and a cellular phone.

17. A semiconductor element according to claim 13, wherein the other portion of the channel region is provided over the recess.

18. A semiconductor element according to claim 13, wherein the projection has a rectangular pattern.

19. A semiconductor element comprising:
a projection and a recess provided over an insulating surface, the projection provided in a linear-shaped stripe pattern and comprising an insulating material;
a crystalline semiconductor region having a plurality of crystal orientations in the recess;
a channel region provided in the crystalline semiconductor region; and
a gate electrode provided adjacent to the channel region with a gate insulating film therebetween,
wherein the crystalline semiconductor region extends in a direction parallel to the linear-shaped stripe pattern, and
wherein a portion of the gate insulating film is provided in contact with the projection.

20. A semiconductor element according to claim 19, wherein the surface of the insulating surface is a surface of an insulating film provided over a glass substrate.

21. A semiconductor element according to claim 19, wherein width of the insulating film which extends in linear stripe pattern is 0.1 to 10 μm, the adjoining pattern interval is 0.01 to 2 μm, and film thickness is 0.01 to 3 μm.

22. A semiconductor element according to claim 19, wherein the semiconductor element is incorporated into one selected from the group consisting of a TV set, a video camera, a personal computer, a personal digital assistant, a sound playback apparatus, a digital camera, and a cellular phone.

23. A semiconductor element according to claim 19, wherein the other portion of the channel region is provided over the recess.

24. A semiconductor element according to claim 19, wherein the projection has a rectangular pattern.

* * * * *